(12) United States Patent  
Zhao et al.

(10) Patent No.: US 9,406,793 B2  
(45) Date of Patent: Aug. 2, 2016

(54) SEMICONDUCTOR DEVICE WITH A VERTICAL CHANNEL FORMED THROUGH A PLURALITY OF SEMICONDUCTOR LAYERS

(71) Applicant: Broadcom Corporation, Irvine, CA (US)

(72) Inventors: Sam Ziqun Zhao, Irvine, CA (US); Frank Hui, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/529,959

(22) Filed: Oct. 31, 2014

(65) Prior Publication Data

US 2016/0005850 A1    Jan. 7, 2016

Related U.S. Application Data

(60) Provisional application No. 62/020,960, filed on Jul. 3, 2014.

(51) Int. Cl.
*H01L 29/78* (2006.01)
*H01L 29/66* (2006.01)
*H01L 29/10* (2006.01)

(52) U.S. Cl.
CPC .......... *H01L 29/781* (2013.01); *H01L 29/1033* (2013.01); *H01L 29/1037* (2013.01); *H01L 29/66666* (2013.01); *H01L 29/7827* (2013.01)

(58) Field of Classification Search
CPC .......................... H01L 29/781; H01L 29/1037
See application file for complete search history.

(56) References Cited

U.S. PATENT DOCUMENTS 5,545,586 A    8/1996 Koh  
6,316,807 B1 * 11/2001 Fujishima ........... H01L 29/7834  
                                                        257/333

(Continued)

FOREIGN PATENT DOCUMENTS

GB    2 366 449 A    3/2002

OTHER PUBLICATIONS

Jones, H., "FinFETs Not the Best Silicon Road," EE Times, Mar. 27, 2014, accessed at http://www.eetimes.com/author.asp?section_id=36&doc_id=1321674&page_number=1; 3 pages.

(Continued)

*Primary Examiner* — Bilkis Jahan  
(74) *Attorney, Agent, or Firm* — Sterne, Kessler, Goldstein & Fox PLLC

(57) ABSTRACT

Semiconductor devices and manufacturing methods are provided for making channel and gate lengths independent from lithography. Also, semiconductor devices and manufacturing methods are provided for increasing resistivity between drain and channel to allow for higher voltage operation. For example, a semiconductor device includes a first doped layer implanted in a semiconductor substrate forming one of a source or a drain and a gate metal layer disposed over the first doped layer. The semiconductor device further includes a second doped layer disposed over the gate metal forming the other the source or the drain, where the first doped layer, the gate metal layer and the second doped layer form a vertical stack of layers of the semiconductor device. The semiconductor device further includes a conduction channel formed in a trench that extends vertically through the vertical stack of layers and terminates at the semiconductor substrate.

20 Claims, 26 Drawing Sheets

(56) References Cited

U.S. PATENT DOCUMENTS

| | | | |
|---|---|---|---|
| 9,048,130 B2 * | 6/2015 | Yamazaki | H01L 27/0688 |
| 2003/0052365 A1 | 3/2003 | Chaudhry et al. | |
| 2006/0131647 A1 * | 6/2006 | Meyer | H01L 29/7802 |
| | | | 257/335 |
| 2008/0135927 A1 * | 6/2008 | Yamaji | H01L 29/7825 |
| | | | 257/328 |
| 2009/0008675 A1 * | 1/2009 | Lu | H01L 29/407 |
| | | | 257/141 |
| 2010/0163979 A1 * | 7/2010 | Hebert | H01L 24/05 |
| | | | 257/335 |
| 2010/0252882 A1 * | 10/2010 | Denison | H01L 29/0865 |
| | | | 257/337 |
| 2013/0193509 A1 * | 8/2013 | Luo | H01L 27/1203 |
| | | | 257/330 |

OTHER PUBLICATIONS

European Search Report directed to related European Patent Application No. 15173558.6, mailed Mar. 10, 2016; 8 pages.

Oh et al., "50 nm Vertical Replacement-Gate (VRG) pMOSFETs," Technical Digest of the International Electron Devices Meeting, Dec. 10-13, 2000; pp. 65-68.

* cited by examiner

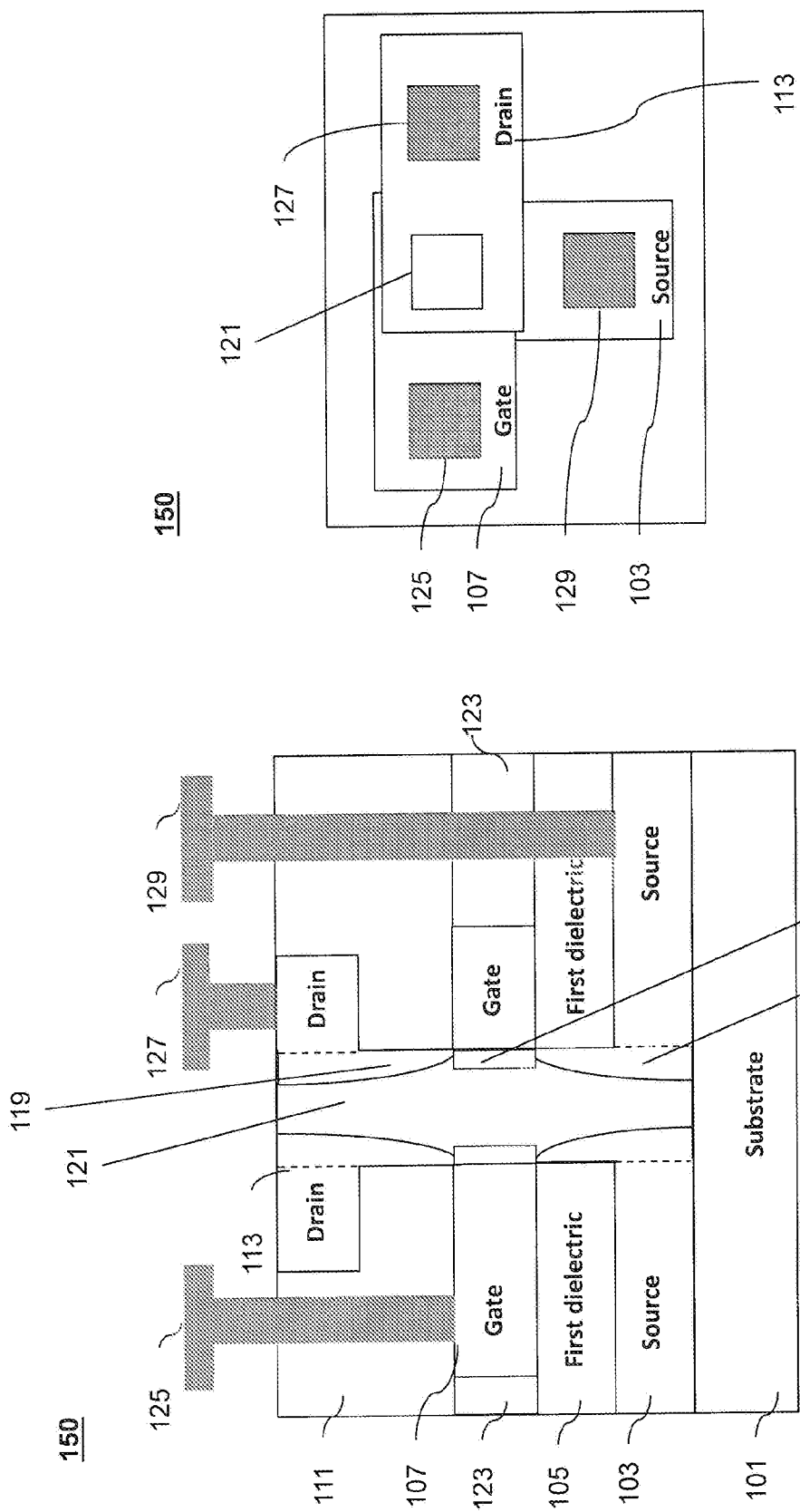

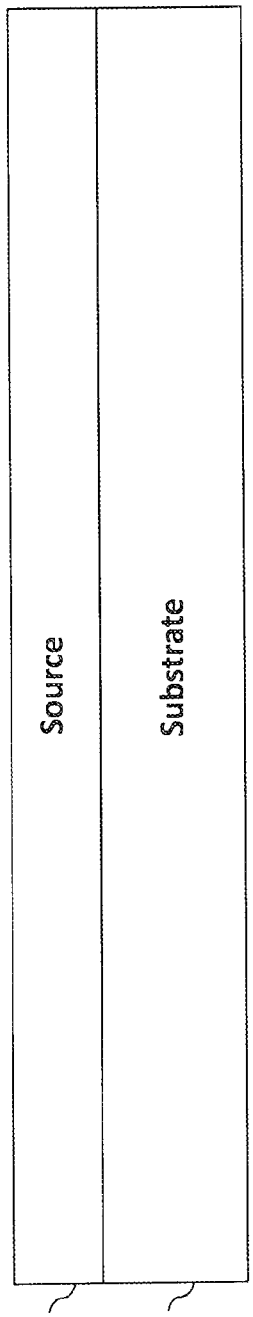
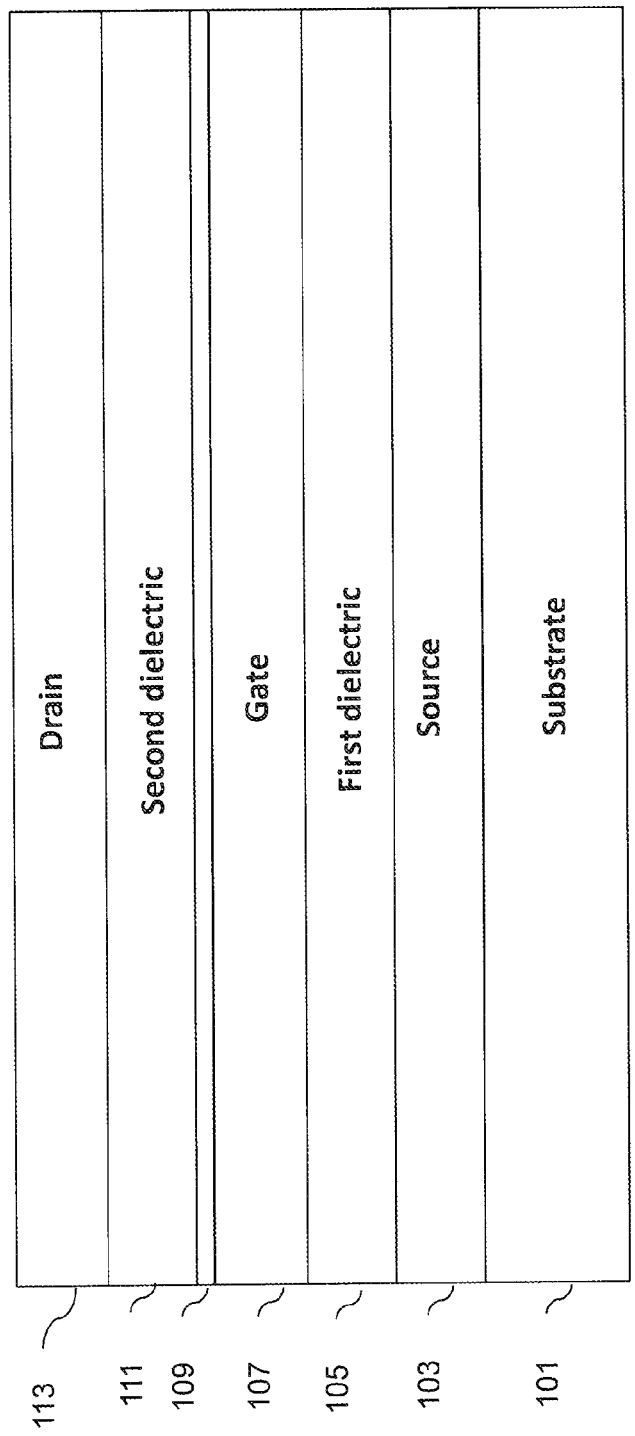

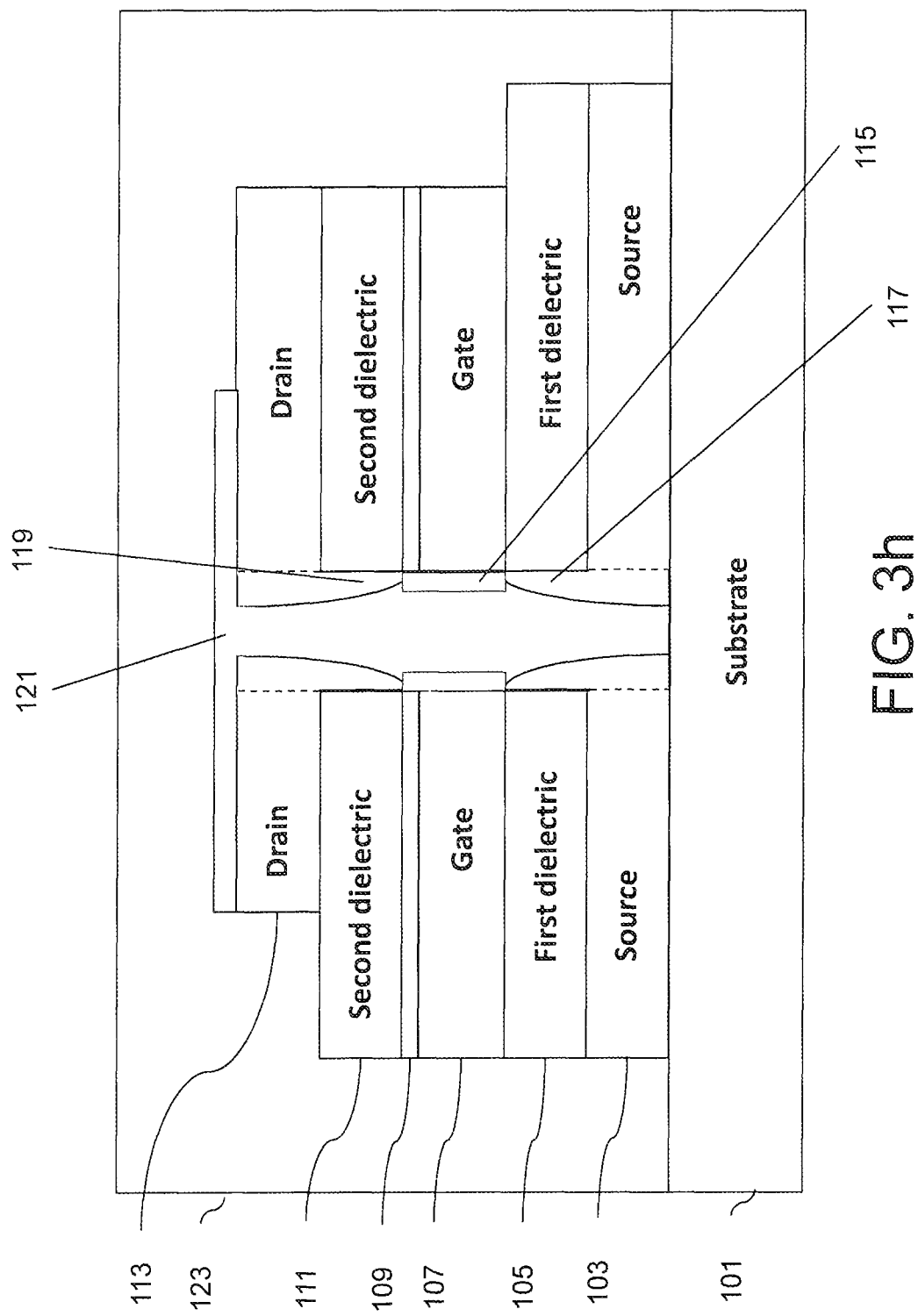

SEMICONDUCTOR DEVICE WITH A VERTICAL CHANNEL FORMED THROUGH A PLURALITY OF SEMICONDUCTOR LAYERS

CROSS REFERENCE TO RELATED APPLICATIONS

The present application claims the benefit of U.S. Provisional Patent Application No. 62/020,960, filed on Jul. 3, 2014, which is hereby incorporated by reference in its entirety.

BACKGROUND

1. Field

The present disclosure relates generally to semiconductor devices with vertical channels and methods of making them.

2. Background Art

In a conventional silicon transistor that includes a source, a gate, and a drain, channel length ($L_G$) is the length between the source to the drain inside a silicon substrate. This channel length is limited by lithography capabilities. In conventional methods, the channel length can be no smaller than 28 nm or 20 nm. The channel length of 20 nm can be achieved using double or multiple patterning, which is expensive as multiple patterning increases the processing cost. As the need for smaller semiconductors increases, there is a need to make the channel length even smaller than 20 nm. As the channel length gets smaller, the gate voltage also gets reduced. However, because of gate capacitance coupling, the gate voltage cannot be scaled as the channel length gets scaled. In other words, one benefit of smaller channel length is that a smaller gate voltage can be applied. However, this gate voltage cannot get smaller than a limit that is forced by gate capacitive coupling in a conventional lateral transistor. Also, smaller channel lengths can result in increased source/drain leakage in the off state. Further, a small channel length can cause drain-induced barrier lowering (DIBL) effect that can result in premature turning on of the transistor when a high drain voltage is applied. Additionally, there are multiple manufacturing challenges with conventional methods for making the channel length smaller, these manufacturing challenges include channel doping uniformity, line edge roughness, and high cost of multiple patterning requirements.

Current projection lithography printing technology can limit channel length. In addition, contacted poly pitch (CPP) less than 78 nm will require multiple patterning for resolution and manufacturability. Also, Extreme Ultra Violate (EUV) can print small channel lengths, however, current throughput is prohibitively slow and high cost, making EUV is undesirable.

Three dimensional (3D) transistors have been developed in an attempt for smaller channel length. For example, FinFET transistors have thin silicon "fins", where each fin includes a double gate region wrapped around the conducting channels. FinFETs have been manufactured with channel lengths of 16 nm or 14 nm. However, these 3D transistors have limitations similar to the conventional 2D (e.g., planar) transistors, such as: the channel length being limited by lithography capability, the gate length being coupled with device pitch, negative effects of gate capacitive coupling, off-state source/drain leakage, DIBL effects, etc. Further, manufacturing 3D transistors is more expensive than 2D transistors. Also, because the fins are pre-manufactured, the gate width in 3D transistors can only be a function of the width of the pre-manufactured fins and not easily changed. Further, because of the 3D structure, the coupling capacity is higher and manufacturing is more challenging as yield problems arise due to stress control and uniformity of the 3D structure.

BRIEF DESCRIPTION OF THE DRAWINGS/FIGURES

The accompanying drawings, which are incorporated herein and form part of the specification, illustrate the present disclosure and, together with the description, further serve to explain the principles of the disclosure and to enable a person skilled in the relevant art(s) to make and use the disclosure.

FIG. 1c illustrates a cut view of a semiconductor device, in accordance with another embodiment of the present disclosure.

FIG. 1d illustrates a top view of a semiconductor device, in accordance with an embodiment of the present disclosure.

FIGS. 3a-3i illustrate a manufacturing process, in accordance with an embodiment of the present disclosure.

Figure 1A:
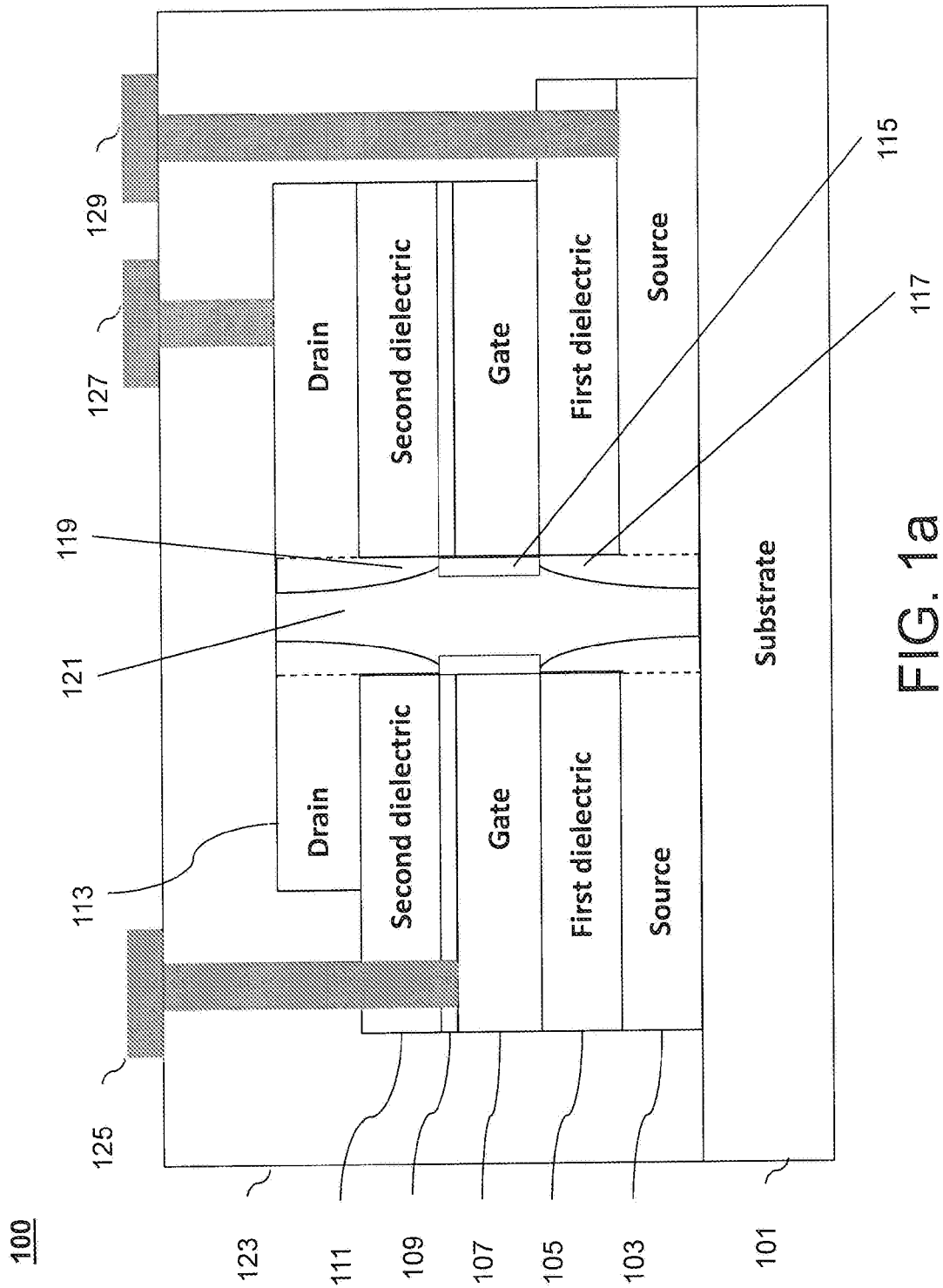
FIG. 1a illustrates a cut view of a semiconductor device, in accordance with an embodiment of the present disclosure.

The present disclosure will now be described with reference to the accompanying drawings. In the drawings, generally, like reference numbers indicate identical or functionally similar elements. Additionally, generally, the left-most digit(s) of a reference number identifies the drawing in which the reference number first appears.

DETAILED DESCRIPTION

Overview

Semiconductor devices and manufacturing methods are provided for making channel and gate lengths independent of lithography limitations, which enables: smaller device feature scaling, better control of short-channel effect, reduced substrate implantation sensitivity, higher drive current per silicon area resulting in faster switching speed, and the ability to decouple device packing density from gate length. Semiconductor devices and manufacturing methods are provided for increasing resistivity between drain and channel to allow for higher voltage operation.

According to one embodiment of the disclosure, a semiconductor device includes a first doped layer implanted in a semiconductor substrate forming one of a source or a drain and a gate metal layer disposed over the first doped layer. The semiconductor device further includes a second doped layer disposed over the gate metal forming the other the source or the drain, where the first doped layer, the gate metal layer and the second doped layer form a vertical stack of layers of the semiconductor device. The semiconductor device further includes a conduction channel formed in a trench that extends vertically through the vertical stack of layers and terminates at the semiconductor substrate.

According to an embodiment of the disclosure, a method is provided that includes implanting a first doped layer in a semiconductor substrate to form one of a source or a drain, depositing a first dielectric layer on the first doped layer, and depositing a gate metal layer on the first dielectric layer. The method further includes depositing a second dielectric layer above the gate metal layer and depositing a second doped layer to form the other of the source or the drain, where the second doped layer, the second dielectric layer, the gate metal layer, the first dielectric layer, and the first doped layer form a vertical stack of layers of the semiconductor device. The method also includes etching a trench that extends vertically through the vertical stack of layers and terminates at the semiconductor substrate and further growing a conduction channel inside the trench, where the conduction channel can operate as a channel from source to drain.

According to another embodiment of the disclosure, a semiconductor device is provided that includes a first doped layer implanted on in a semiconductor substrate forming one of a source or a drain, a first dielectric layer disposed over the first doped layer, a gate metal layer disposed over the first dielectric layer, and a second dielectric layer disposed over the gate metal layer. The semiconductor device further includes a second doped layer disposed over the second dielectric layer forming the other of the source or the drain, where the first doped layer, the first dielectric layer, the gate metal layer, the second dielectric layer, and the second doped layer form a vertical stack of layers of the semiconductor device. The semiconductor device further includes a conduction channel formed in a trench that extends vertically through the vertical stack of layer, where a width of the conduction channel at the gate metal layer is smaller than a width of the conduction channel at the first dielectric layer underneath the gate metal layer.

According to an embodiment of the disclosure, a method is provided that includes implanting a first doped layer in a semiconductor substrate to form one of a source or a drain and depositing a first dielectric layer over the first doped layer. The method further includes depositing a first hard mask layer over the first dielectric layer and etching a trench inside the first dielectric layer, where a width of the trench inside the first dielectric layer is defined by the first hard mask, and forming a first part of a conduction channel inside the trench inside the first dielectric layer. The method also includes depositing a body mask and a second hard mask layer over the first hard mask and the first part of the conduction channel and etching a trench inside the body mask, where a width of the trench inside the body mask is defined by the second hard mask. The method further includes forming a second part of the conduction channel inside the body mask, where a width of the second part of the conduction channel inside the body mask is smaller than a width of the first part of the conduction channel inside the first dielectric layer. The method further includes removing the body mask and the two hard mask layers. The method also includes forming a gate oxide layer on top of and around the second part of the conduction channel, depositing a gate metal layer over the first dielectric layer around the second part of the conduction channel, and forming a gate isolation layer over the first dielectric layer around the gate metal layer and away from the second part of the conduction channel. The method further includes removing the gate oxide layer on top of the second part of the conduction channel, depositing a second dielectric layer over the gate isolation layer and the gate metal layer and around the second part of the conduction channel. The method also includes depositing a silicon pad over the second part of the conduction channel that has a width larger than the width of the second part of the conduction channel and implanting a second doped layer over the silicon pad and the second dielectric layer to form the other the source or the drain Detailed Discussion The following Detailed Description of the present disclosure refers to the accompanying drawings that illustrate exemplary embodiments consistent with this disclosure. The exemplary embodiments will so fully reveal the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein. Therefore, the detailed description is not meant to limit the present disclosure, The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

FIG. 1a illustrates a cut view of semiconductor device 100, according, to an embodiment of the present disclosure. Semiconductor device 100, which can include a semiconductor vertical gate all around metal-oxide-semiconductor (VGAA-MOS), is built on semiconductor substrate 101 such as a silicon substrate. Semiconductor device 100 includes a first doped layer that can operate as a source layer 103, which is implanted in the semiconductor substrate 101. Semiconductor device 100 further includes a first dielectric layer 105 that is deposited over source layer 103. First dielectric layer 105 is arranged as a spacer between the source layer 103 and a gate layer 107.

Semiconductor device 100 further includes the gate metal layer 107 deposited over first dielectric layer 105. The thickness (e.g. vertical thickness) of gate metal layer 107 can be adjusted to achieve a desired gate channel length. According to embodiments of this disclosure, gate metal layer 107 can comprise titanium, titanium nitride, tantalum, tantalum nitride, aluminum, tungsten, or any other suitable metal or metal alloy. Additionally, gate metal layer 107 can comprise any combination of suitable metals or metal alloys. Gate metal layer 107 can be deposited using physical vapor deposition (PVD), chemical vapor deposition (CVD), atomic layer deposition (ALD), or any other suitable method of deposition.

A critical dimension of semiconductor device 100 is the gate metal layer thickness (e.g. vertical thickness in device 100) because it defines the gate channel length of the device 100, and gate channel length controls the overall switching speed or frequency of the device. According to one example, gate metal layer 107 is deposited using ALD or other thin film deposition methods, which provides single atomic layer precision so that the gate metal layer thickness can be as thin as 15A (1.5 nm). Therefore, the thickness of gate metal layer 107 can be more accurately controlled and made smaller than that provided by corresponding lithography methods.

Semiconductor device 100 further includes a hard mask layer 109 deposited over gate metal layer 107, and a second dielectric layer 111 deposited over the hard mask layer 111. Semiconductor device 100 also includes second doped layer 113 deposited over second dielectric layer 111, which operates as drain layer 113. According to this embodiment, hard mask layer 109 is arranged and configured to isolate the drain layer 113 from gate metal layer 107. As illustrated, the source layer 103 is the bottom most layer of the semiconductor device 100, and the drain layer 113 is the top most layer. One skilled in the art will recognize that the relative positions of source layer 103 and the drain layer 113 could be switched, so that the drain layer is the most bottom layer (implanted in or on the bulk substrate 101) and source layer is the top most layer.

The various layers of semiconductor device 100 provide a vertical stack of layers. Semiconductor device 100 further includes a rectangular or circular trench (e.g. hole or via) that extends vertically through the vertical stack of layers including drain layer 113, second dielectric layer 111, hard mask layer 109, gate metal layer 107, first dielectric layer 105, and source layer 103 and where the trench terminates at substrate 101. Although a rectangular trench or a square or circular hole are referenced in this disclosure, it is apparent to a person skilled in the relevant art that other shapes of trenches can be used. This rectangular trench or circular hole includes conduction channel 121, which can be formed using epitaxy or ALD according to various embodiments so that the conduction channel is a solid cylinder or rectangular block of semiconductor material. In one example, conduction channel 121 can include a silicon material that is doped lightly with respect to source layer 103 and drain layer 113 and that extends vertically through both drain layer 113 and source layer 103. Additionally or alternatively, conduction channel 121 can be doped with a material different from doping of drain layer 113 and source layer 103.

The semiconductor device operates as a field effect transistor (FET), where an appropriate gate voltage forms a conducting channel for "carriers" (e.g. electrons or holes) that travel from the source layer 103 to drain layer 113. In this example, the current flows vertically from the drain layer 113 to the source layer 103 (for electron carriers) in a direction perpendicular to the surface of substrate 101. The gate channel length of the semiconductor device 100 is defined by thickness of gate metal layer 107, which is in electrical contact with the conduction channel 121. Although, the entire conduction channel 121 is able to operate as a channel, carriers will tend to accumulate on the outer surface of the conduction channel 121 close to the gate layer due the electric field at the gate, as will be understood by those skilled in the arts. Accordingly, the carrier conduction channel is a vertical wall shaped accordingly to the outer surface of the conduction channel 121, and therefore may be cylindrical, rectangular, or another shape that is defined by the inner surface trench holding the conduction channel 121. This structure provides increased junction contact area for the conduction channel 121 with the gate layer 107 when compared to conventional structures because the gate layer 107 surrounds, and is in electrical contact with, the conduction channel 121. Accordingly, the semiconductor device 100 supports increased carrier flow from the source layer 103 to the drain layer 113, and therefore supports higher switching current when compared to conventional structures.

Semiconductor device 100 further includes a gate work-function and high-k dielectric 115 that is formed over a portion of gate metal layer 107 on the inner surface of the rectangular trench or circular hole. As shown in FIG. 1*a*, gate work-function and high k dielectric 115 covers gate metal 107 inside the trench, and starts at the intersection of first dielectric layer 105 and gate metal layer 107 inside the trench and stops at intersection of the hard mask layer 109 and second dielectric layer 111 contact. Gate work-function and high-k dielectric 115 wraps around conduction channel 121, so as to facilitate the gate metal contact.

Semiconductor device 100 further includes a first extension, such as source extension 117 that is grown inside the trench from the source layer 103 to a bottom portion of gate metal layer 107, and operates to extend the source toward the gate region. The dotted lines on FIG. 1*a* illustrate the boundary between source extension 117 and source layer 103. According to one example, source extension 117 can be doped similar to source layer 103. Alternatively, the doping of source extension 117 can be different than the doping of source layer 103. For example, different materials can be used for the doping source extension layer 117 and source layer 103. Additionally or alternatively, similar material can be used, however, source extension 117 can be doped lighter or heavier compared to source layer 103. Semiconductor device 100 further includes a second extension, such as drain extension 119 that is grown inside the trench from the drain layer 113 to a top portion of hard mask layer 109. The dotted lines on FIG. 1*a* illustrate the boundary between drain extension 119 and drain layer 113. According to one example, drain extension 119 can be doped similar to drain layer 113. Alternatively, the doping of drain extension 119 can be different than the doping of drain layer 113. For example, different materials can be used for the doping drain extension layer 119 and drain layer 113. Additionally or alternatively, similar material can be used, however, drain extension 119 can be doped lighter or heavier compared to drain layer 113. According to one example, source and drain extensions 117 and 119 can be grown using solid source diffusion. Additionally or alternatively, source and drain extensions 117 and 119 can be deposited using selective deposition methods. The extensions 117, 119 extend the source and drain respectively toward the gate region so as to facilitate carrier flow. In one example, source and drain extensions 117 and 119 can also increase the switching current.

Semiconductor device 100 can also include isolation trenches around source layer 103, first dielectric layer 105, gate metal layer 107, hard mask layer 109, second dielectric layer 111, and drain layer 113. These isolation trenches can be filled with isolation material 123, such as oxide. Semiconductor device 100 can further include gate contact 125, drain contact 127, and source contact 129 that are connected to gate metal layer 107, drain layer 113, and source layer 103, respectively. The contacts 125-129 can be used to provide the necessary voltages to operate the semiconductor device 100.

Figure 1B:
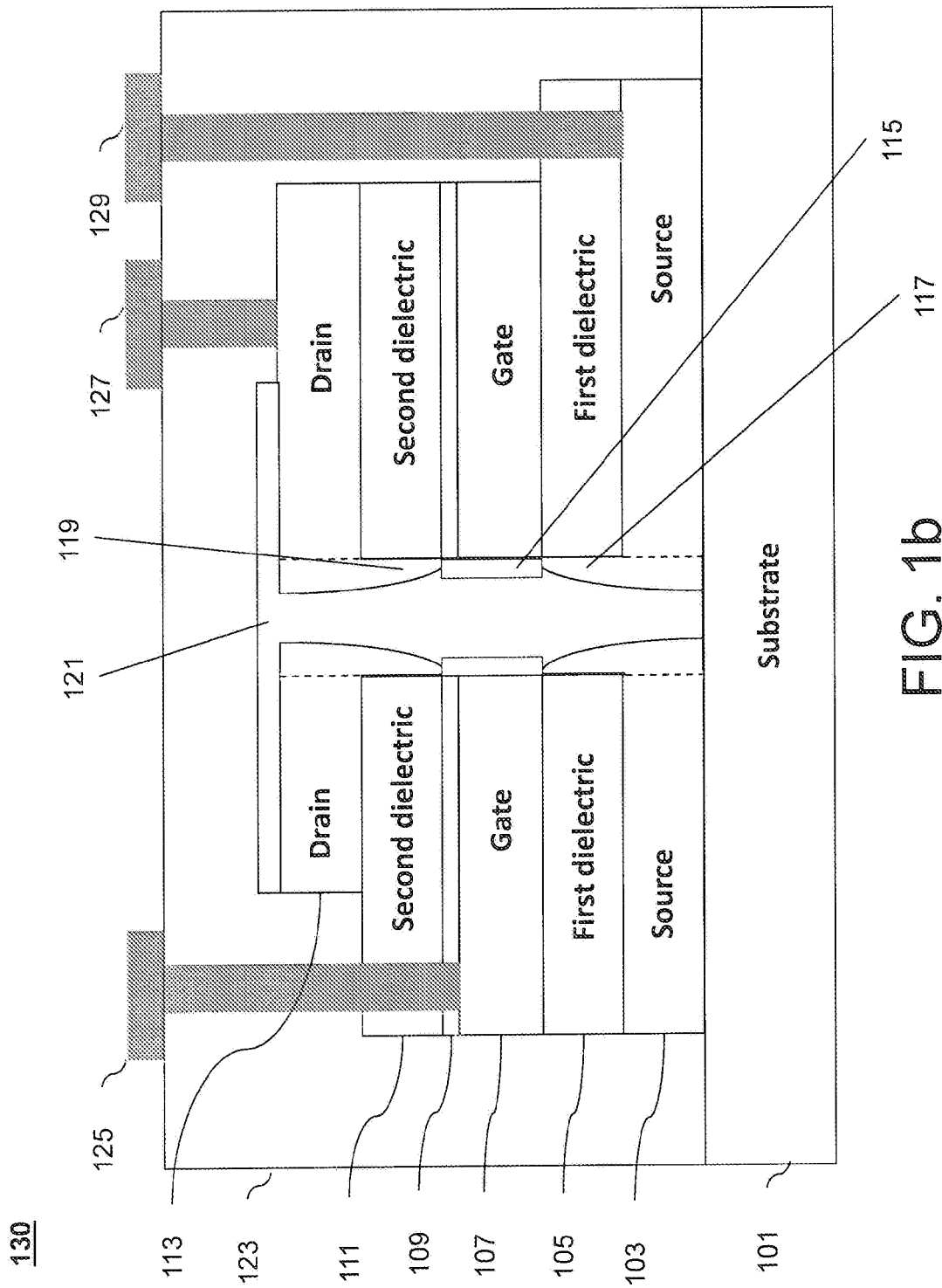
FIG. 1b illustrates a cut view of a semiconductor device, in accordance with another embodiment of the present disclosure.

FIG. 1*b* illustrates a cut view of semiconductor device 130, according to another embodiment of the present disclosure. In the exemplary embodiment of FIG. 1*b*, conduction channel 121 is extended beyond the trench to cover a portion of the drain layer 113 to form an extended electrical connection layer over drain layer 113.

FIG. 1*c* illustrates a cut view semiconductor device 150, according to another embodiment of the present disclosure. In the exemplary embodiment of FIG. 1*e*, second dielectric layer 111 does not terminate at the lower side (side closer to substrate 101) of drain 113. Instead, the top side of second dielectric layer 111 (side further from substrate 101) is flush with the top side of drain layer 113 (side further from substrate 101) as shown. Further, semiconductor device 150 can include an isolation layer 123 that wraps around (or encompasses) gate metal layer 107. FIG. 1d illustrates a top view of a semiconductor device 150, according to an embodiment of the present disclosure. According to this example, gate metal layer 107 is located between source layer 103 and drain layer 113. A top portion of conduction channel 121 is visible in FIG. 1d and extends through source layer 103, gate layer 107, and drain layer 113.

Figure 2A:
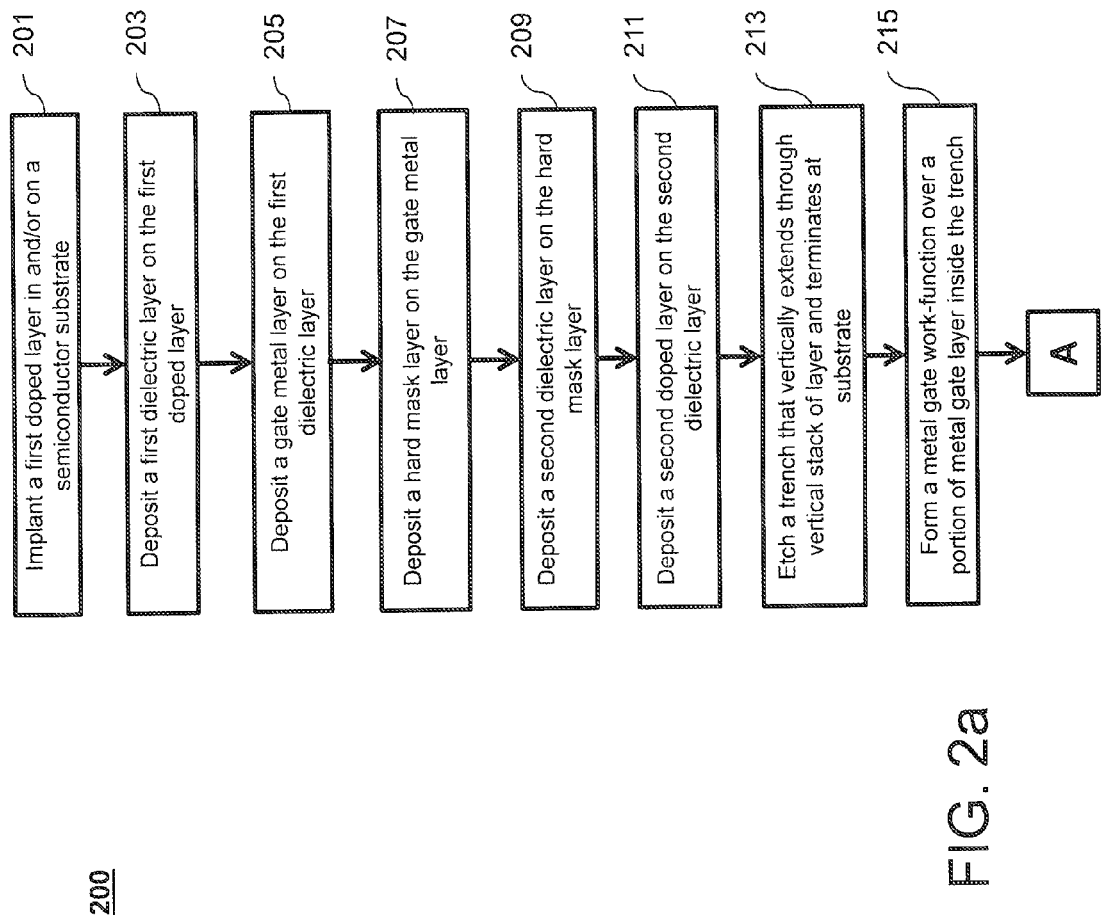
FIGS. 2a-2b are flowcharts illustrating a manufacturing process, in accordance with an embodiment of the present disclosure.
Figure 2B:
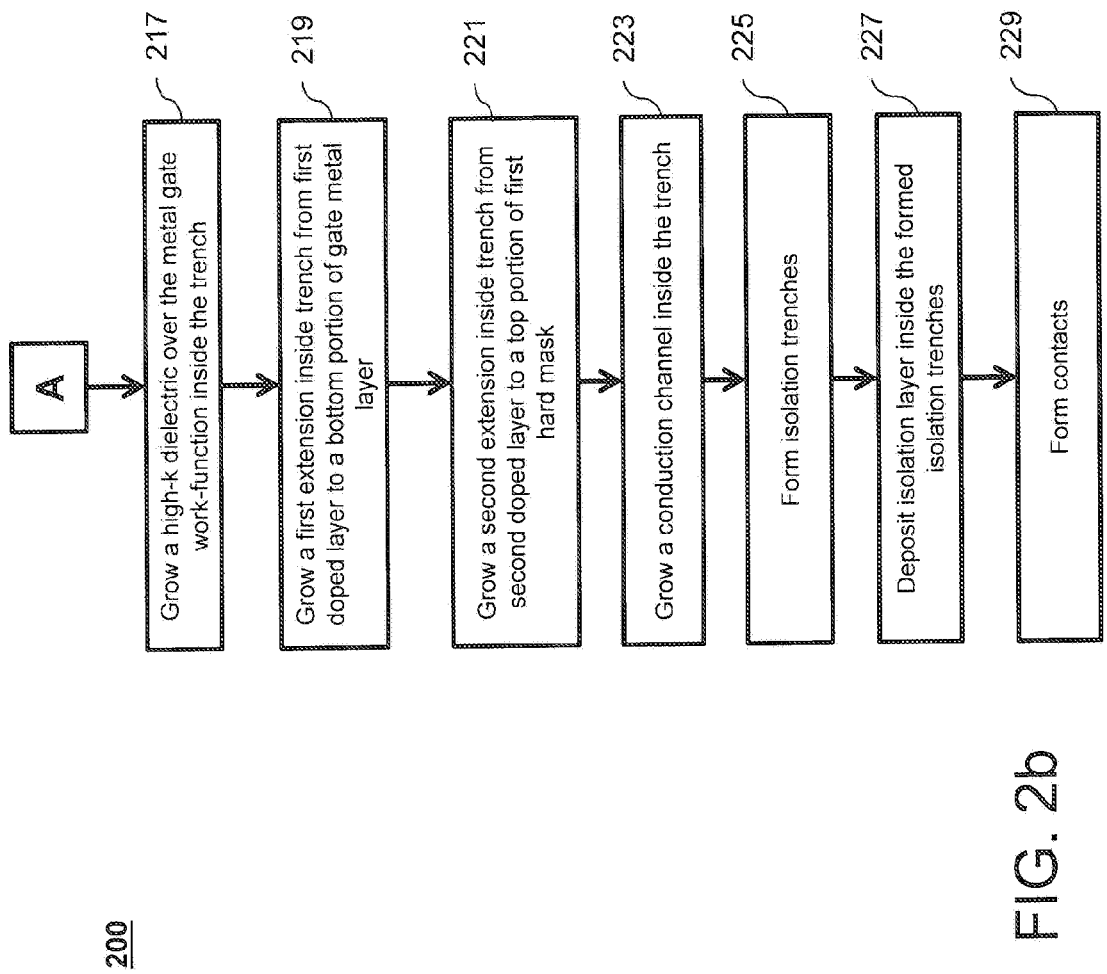

FIGS. 2a-2b and 3a-3i illustrate a manufacturing process for manufacturing one or more of semiconductors 100, 130, and 150, in accordance with an embodiment of the present disclosure. The steps in the flowcharts of FIG. 2a-2b are illustrated in FIGS. 3a-3i. It is to be appreciated not all steps may be needed to perform disclosure provided herein. Further, some of the steps may be performed simultaneously, or in a different order than that shown in FIGS. 2a-2b and 3a-3i, as will be understood by those skilled in the art.

In step 201, as shown in FIG. 3a, a first doped layer, such as source layer 103, is implanted in or on substrate 101.

As illustrated in FIG. 3b and steps 203-211, a multilayer stack deposition is performed. In step 203, a first dielectric layer 105 is deposited over the first doped layer, namely the source layer 103. According to one example, first dielectric layer 105 acts as a spacer between the source layer 103 and the gate metal layer 107. In step 205, gate metal layer 107 is deposited on top the first dielectric layer 105. According to embodiments of this disclosure, the gate metal layer 107 can be deposited by physical vapor deposition (PVD), chemical vapor deposition (CVD), atomic layer deposition (ALD), or any other suitable method of deposition. The thickness of gate metal layer 107, which defines the gate channel length, can be adjusted to achieve a desired gate channel length. In embodiments, when ALD deposition is used for deposition, the metal layer thickness can be as thin as a few atomic layers (1.5 nm, for example.)

In step 207, hard mask layer 109 is deposited on gate metal layer 107 to isolate drain layer 113 from gate metal layer 107. In step 209, second dielectric layer 111 is deposited over hard mask layer 109 and in step 211, a second doped layer, such as drain layer 113, is deposited on second dielectric layer 111. The multilayer stack deposition performed in FIG. 3b and steps 203-211 can be done using atomic layer deposition, chemical epitaxy, physical epitaxy, or any other deposition or growth method.

According to one example, the vertical thickness of gate metal layer 107 can approximately be 10 nm, 7 nm, 5 nm, 3 nm, 2 nm, or below. The vertical thickness of source layer 103 and drain layer 113 can approximately be 10 nm-100 nm. The vertical thickness of first and second dielectric layers 105 and 111 can approximately be similar to the vertical thickness of source and drain layers 103 and 113. Those skilled in the relevant art will recognize that other thickness can be used.

Figure 3C:
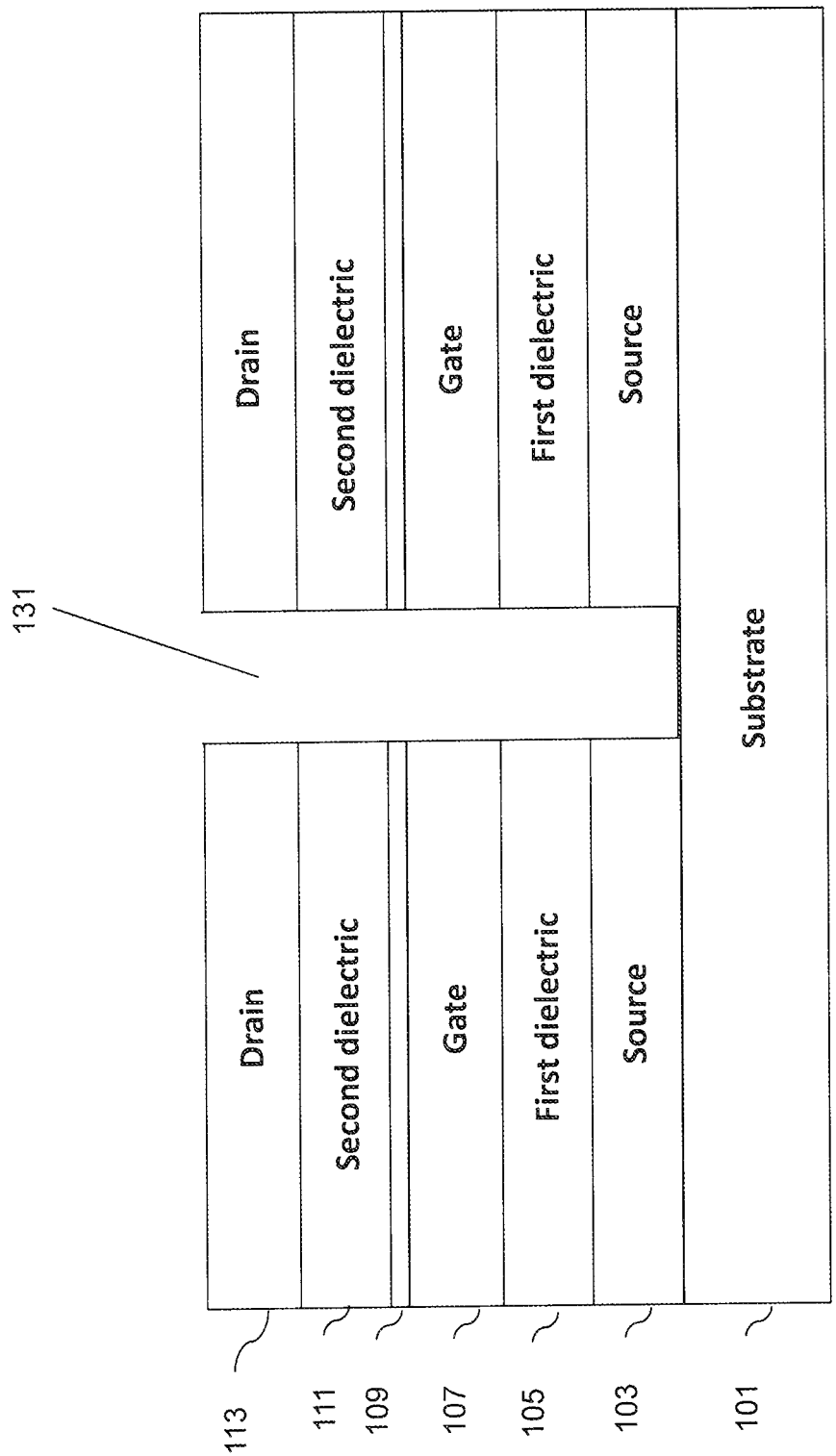

In step 213, as illustrated in FIG. 3c, a rectangular trench or a circular hole 131 is etched vertically through the multiple vertical layers including drain layer 113, second dielectric layer 111, hard mask layer 109, gate metal layer 107, first dielectric layer 105, and source layer 103 and terminates at substrate 101. Although a rectangular trench or a circular hole 131 are referenced in this disclosure, it will be apparent to a person skilled in the relevant art that other shapes of trenches can be used. According to one example, etching trench 131 through different layers can include putting a mask over the second doped layer, such as drain layer 113 and etching the multiple vertical layers using an etching process for portions of the drain layer 113 that are not masked. According to one example, According to one example, etched trench 131 has a diameter/width of around 20 nm-50 nm without double patterning or smaller with double patterning. For example, etched trench 131 can have a diameter/width of around 28 nm. It is noted that the etched trench can also have smaller widths by using, for example, double or multiple patterning. According to one example, the thickness of source layer 103 and drain layer 113 can approximately be on the order of 10 nm~100 nm. Those skilled in the relevant art will recognize that other thickness can be used.

Figure 3D:
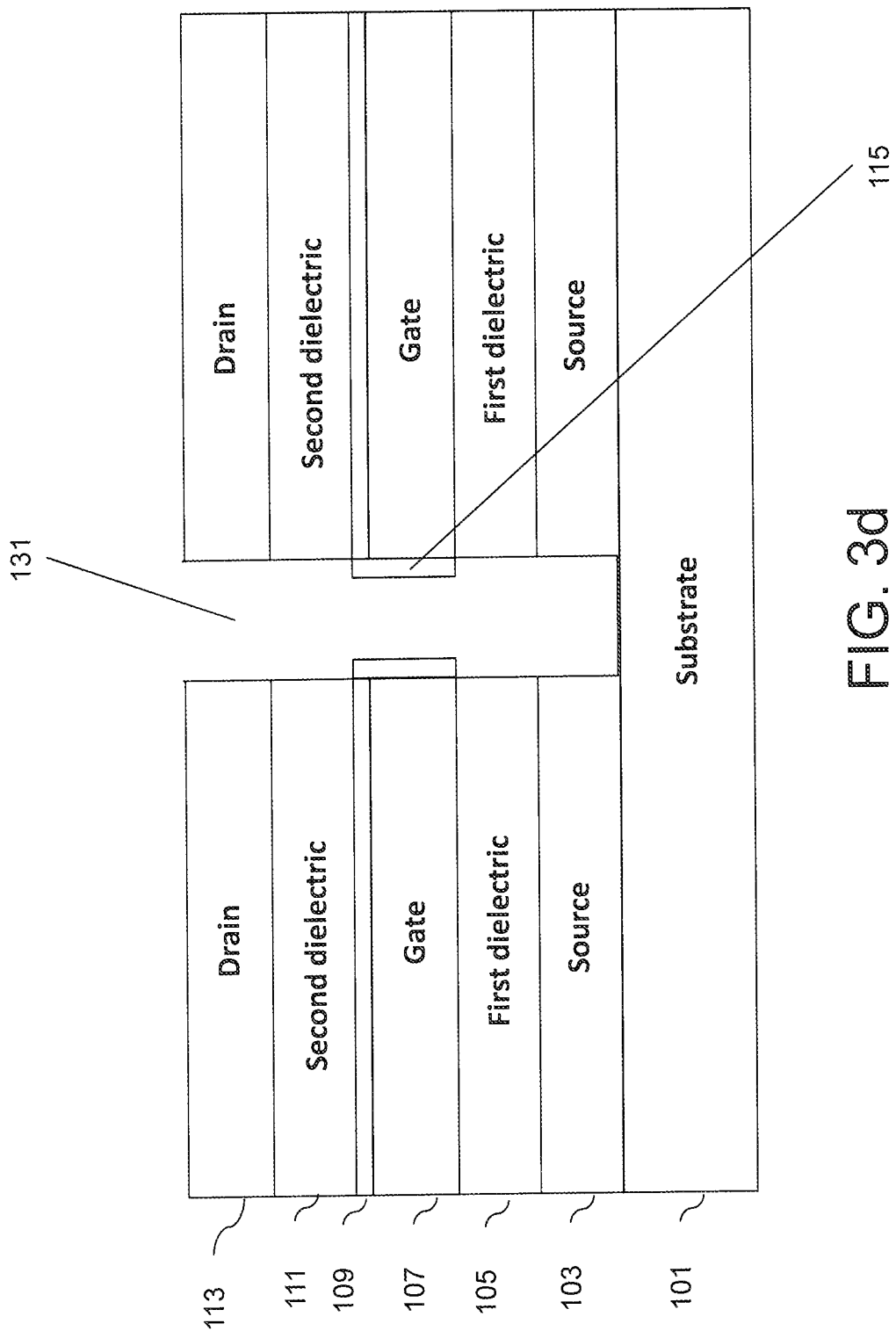

In step 215, as illustrated in FIG. 3d, a metal gate work-function is grown over a portion of metal gate layer 117 inside trench 131. Growing the metal gate work-function can include depositing multiple different metal materials on gate metal layer 107 inside trench 131 as the multiple different metal materials are naturally attracted to the portion of metal gate layer 117 inside trench 131. In step 217, a high-k dielectric material is grown over the metal gate work function. As shown in FIG. 3d, the metal gate work-function and high-k dielectric 115 starts where first dielectric layer 105 and gate metal layer 107 intersect, and terminates where hard mask layer 109 and second dielectric layer 111 intersect. Gate work-function and high-k dielectric 115 wraps around conduction channel 121. In one example, gate work-function and high-k dielectric 115 raises the dielectric constant in the gate region, which lowers the threshold voltage for the resulting FET.

Figure 3E:
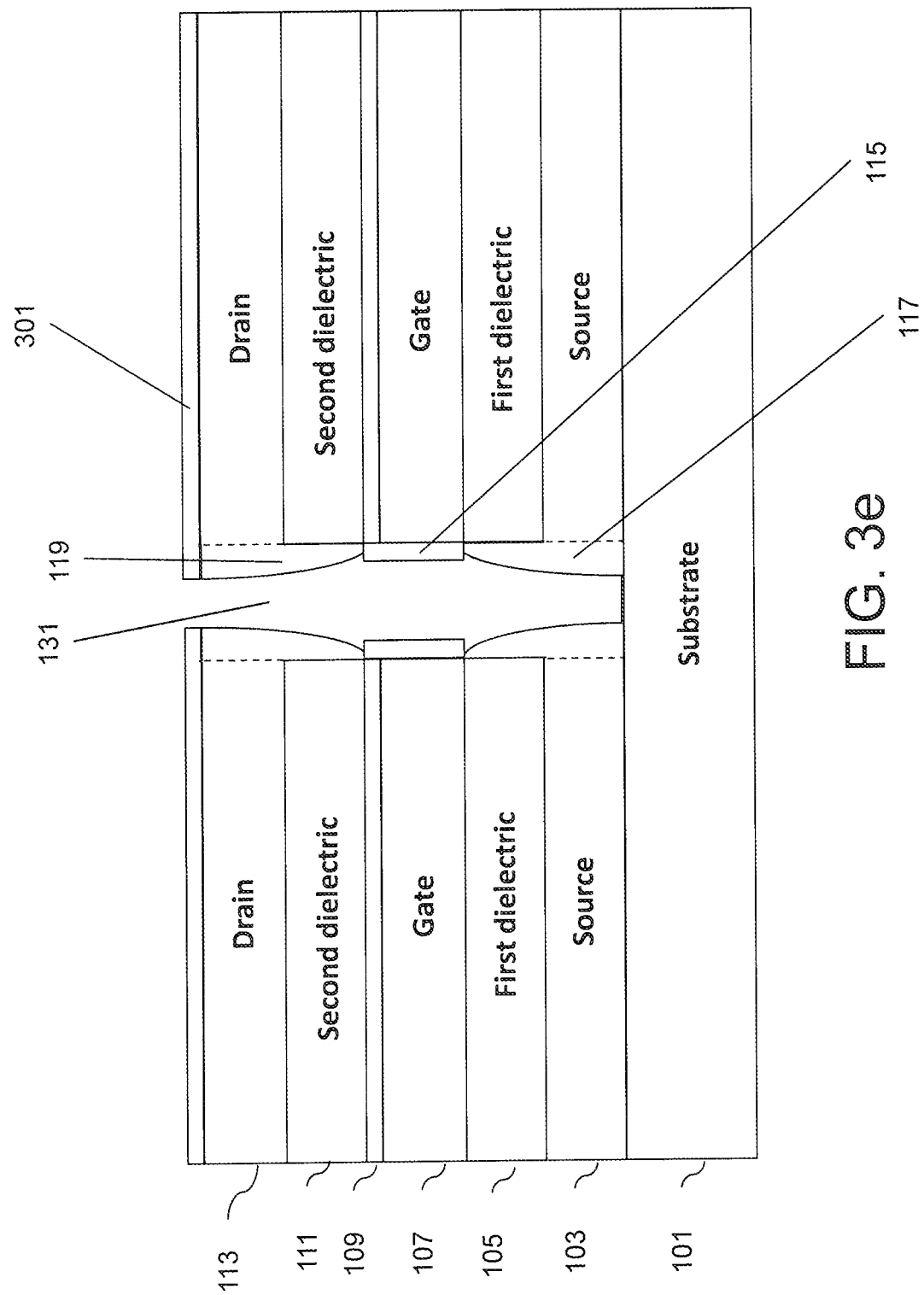

In step 219, as shown in FIG. 3e, a first extension, such as source extension 117 is grown inside trench 131 from the first doped layer, such as source layer 103 to a bottom portion of gate metal layer 107 that is inside the trench 131. In step 221, as shown in FIG. 3e, a second extension, such as drain extension 119 is grown inside trench 131 from the second doped layer, such as drain layer 113 to a top portion of hard mask layer 109. In one example, the second extension, such as drain extension 119 is grown from the second doped layer, such as drain layer 113 to a top portion of hard mask layer 109 so that hard mask layer 109 can prevent drain layer 113 and gate metal layer 107 from being electrically shortened. As shown in FIG. 3e, the extensions 117, 119 extend the source and drain respectively toward the gate region so as to facilitate carrier flow.

According to one example, source and drain extensions 117 and 119 can be grown using solid source diffusion. Additionally or alternatively, source and drain extensions 117 and 119 can be deposited using a mask and selective deposition methods. According to one example, a layer of doped material 301 will be deposited on drain layer 113 during the deposition of source/drain extensions. According to this example, layer 301 will be etched before the process moves to next steps. According to one example, source and drain extensions 117 and 119 can result in increased cross section area such that electrons can easily flow across the channel.

Figure 3F:
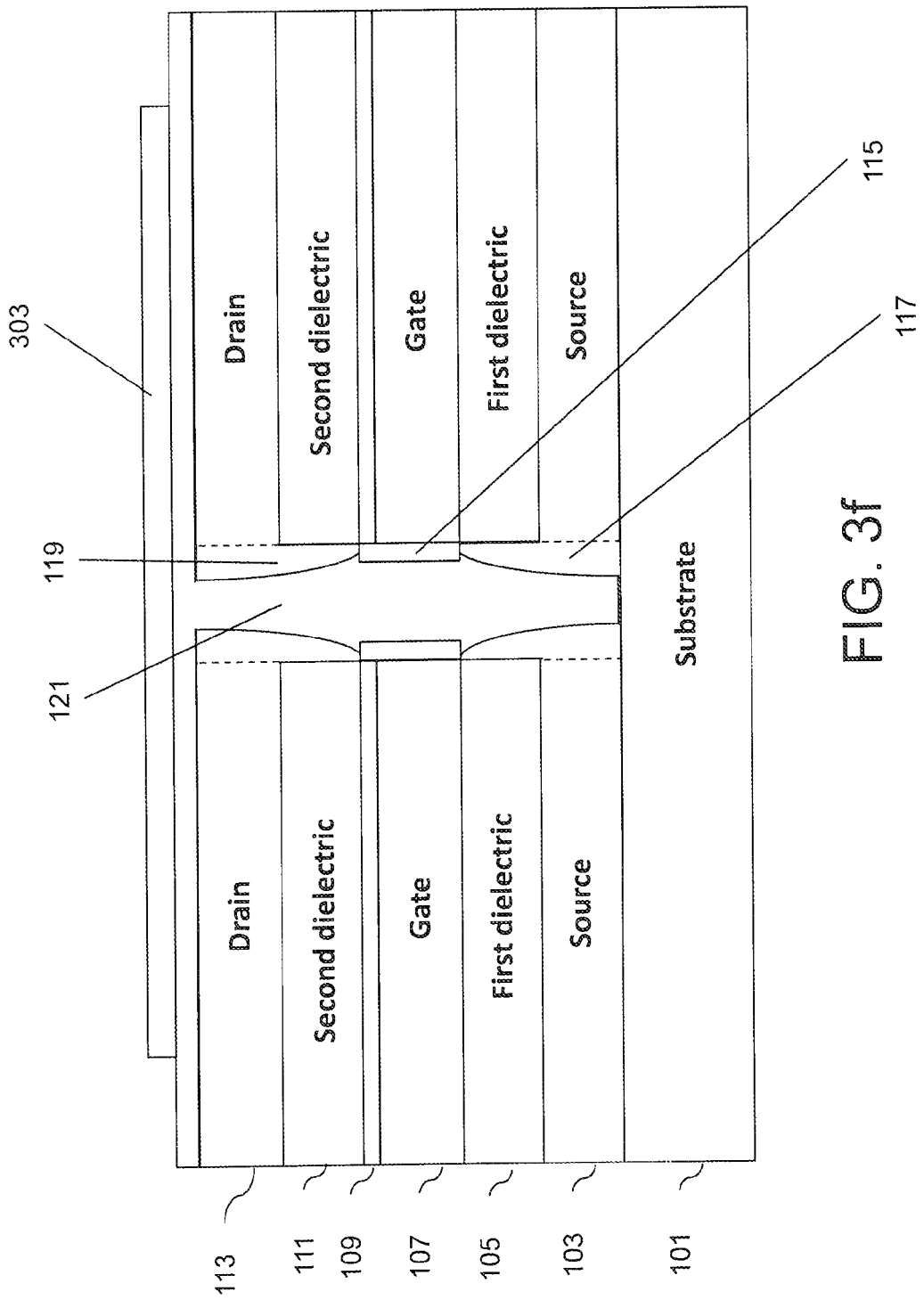

In step 223, as shown in FIG. 3f, conduction channel 121 is formed (e.g., grown) in the trench (that extends vertically through the vertical stack of layers) and also over drain layer 113. In this example, conduction channel 121 formed in the trench extends beyond the trench to cover a portion of drain layer 113 to form a layer disposed over drain layer 113 for better electrical connection. According to one example, conduction channel 121 can include a silicon channel and can be formed (e.g., grown) using epitaxy method such as ALD, although other deposition methods can also be used. Conduction channel 121 can include a lightly-doped material that extends through both drain layer 113 and source layer 103. For example, conduction channel 121 can include a silicon material that is doped relatively lightly with respect to first and second doped layers 103 and 113. Alternatively or additionally, conduction channel 121 can be doped with a material that is different from the doping of first and second doped layers 103 and 113. Additionally or alternatively, conduction channel 121 can include high mobility material such as Germanium (Ge), Gallium arsenide (GaAs), Silicon carbide (SiC), silicon-germanium (SiGe), etc. As discussed above, the gate channel length is defined by thickness of gate metal layer 107 and the conduction channel is a vertical wall wrapped around in cylindrical, rectangular, or other shape.

Additionally, step 223 can include depositing a hard mask layer 303 over the extension of conduction channel 121 that is extended over drain layer 113. According to this example, hard mask layer 303 can define the boundaries for the semiconductor device's isolation, as discussed below in step 225. According to one example, the extended electrical connection layer that is extended over drain 113 can further direct the current between source layer 103 and drain layer 113. FIG. 1b illustrates an exemplary embodiment of semiconductor device 130 where the extended electrical connection layer that is extended over drain 113.

According to one exemplary embodiment, the extended electrical connection layer that is extended over drain 113 can be removed before hard mask layer 303 is deposited. In this example, a mechanical or chemical polishing process, an etching process, an atomic layer removal (where atomic layers are removed layer by layer), or other removal processes can be used to remove the extended electrical connection layer that is extended over drain 113. In this embodiment hard mask layer 303 is deposited over drain layer 113 and on the top layer of conduction channel 121 that is in still inside the trench 313 and flush with the top layer of drain layer 113. FIG. 1a illustrates an exemplary embodiment of semiconductor device 100 where the conduction channel layer that is not extended over drain 113.

Figure 3G:
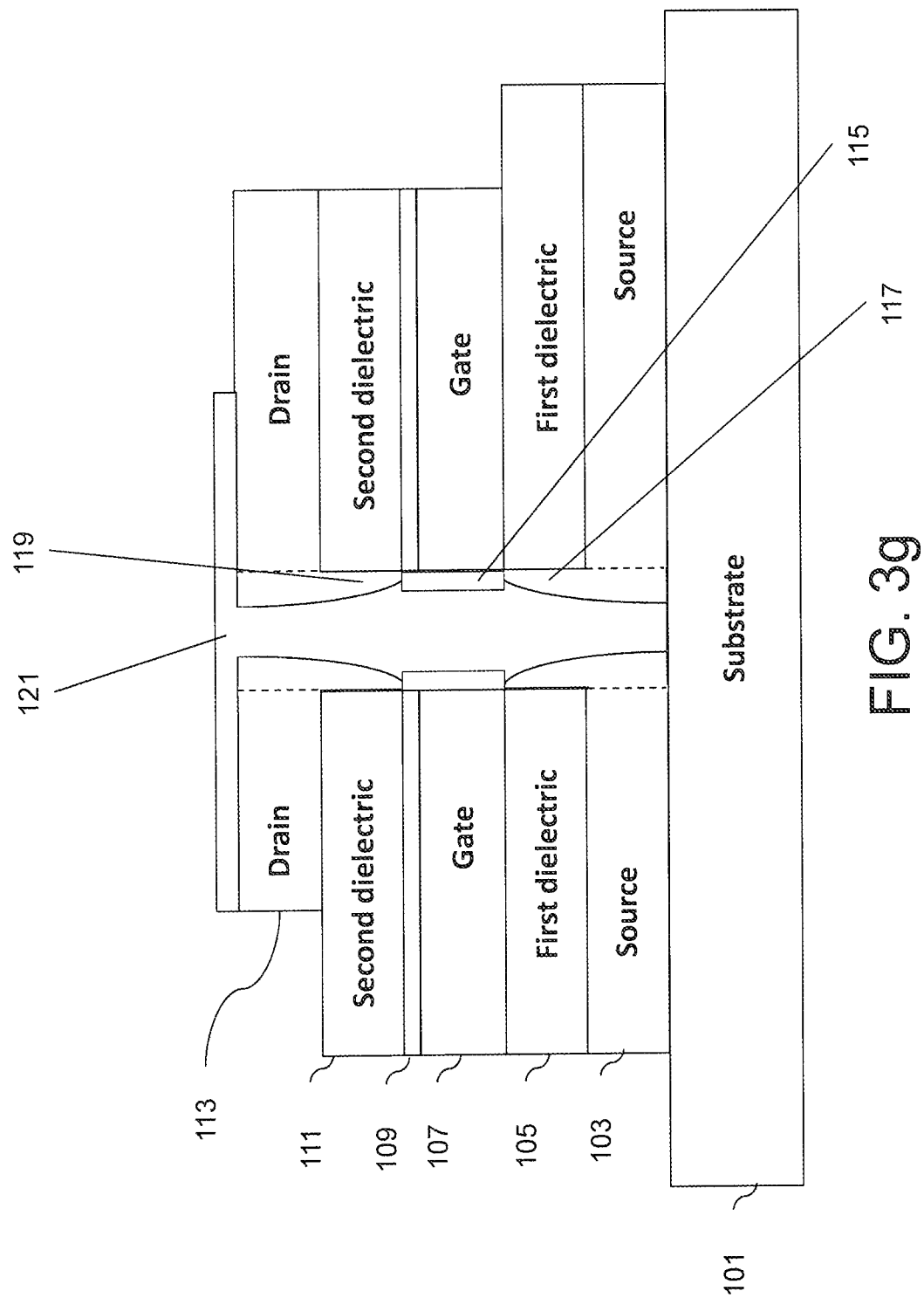

In step 225, as illustrated in FIG. 3g, isolation trenches are formed around source layer 103, first and second dielectric layers 105 and 111, gate layer 107, hard mask layer 109, and drain layer 113. According to one example, hard mask layer 303, as shown in FIG. 3f can be used as a mask to etch vertical stack of layers 103, 105, 107, 109, 111, and 113 such that the width of these layers in the cross section FIG. 3g are substantially similar to the width of layers 103 and 105 in the cross section FIG. 3g. According to this example, hard mask layer 303 can be removed after the etching the isolation trenches using removal processes known to skills in the art. Continuing with this example, a gate isolation mask (not shown) can be put over drain layer 113 and the extended electrical connection layer that is extended over drain layer 113 to etch a gate isolation trench. According to this example, the gate isolation mask is used to etch layers 107, 109, 111, and 113 such that the width of these layers in the cross section FIG. 3g be substantially similar to the width of gate metal layer 107 in the cross section FIG. 3g.

Additionally, after removing the gate isolation mask (not shown), a drain isolation mask can be put over drain layer 113 and extended electrical connection layer extended over drain layer 113 to etch a drain isolation trench. According to this example, the drain isolation mask is used to etch drain layer 113 and extended electrical connection layer extended over drain layer 113 such that the width of these layers in the cross section FIG. 3g be substantially similar to the width of drain layer 113 in the cross section FIG. 3g. Further, after removing the drain isolation mask, a drain contact mask (not shown) can be put over drain layer 113 and extended electrical connection layer extended over drain layer 113 to etch a drain contact trench. According to this example, extended electrical connection layer extended over drain layer 113 is etched to the length shown in the cross section FIG. 3g to open space for drain contact. After etching the drain contact trench, the drain contact mask is removed.

Figure 3I:
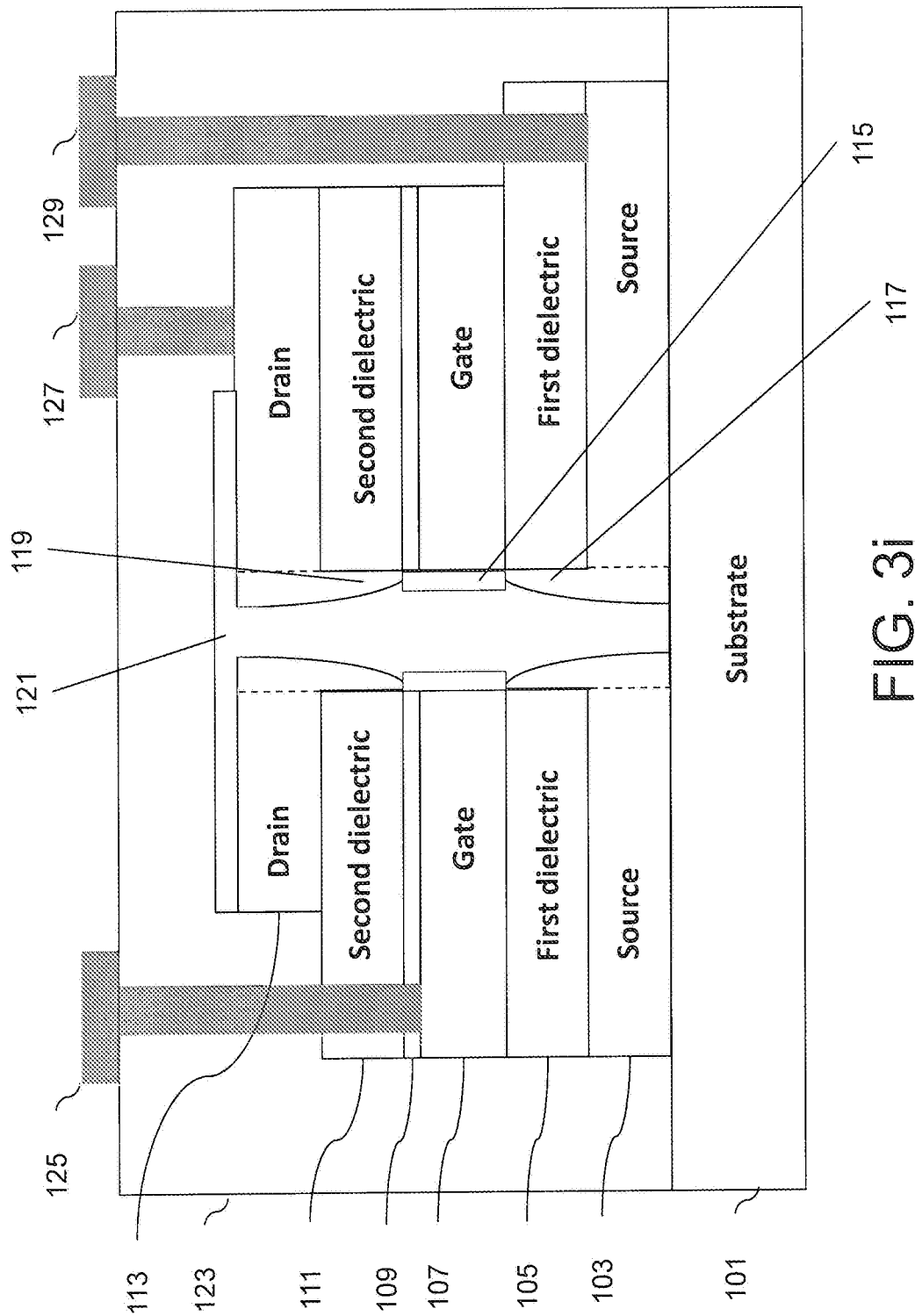

In step 227, as illustrated in FIG. 3h, an isolation layer 123 is deposited inside the isolation trenches. In step 229, as shown in FIG. 3i, gate contact 125, drain contact 127, and source contact 129 are formed. Forming gate contact 125 can include etching a trench (or via) through isolation layer 123, second dielectric layer 111, and hard mask layer 109 (using, for example, a mask) and filling the etched trench with metal fill. Forming drain contact 127 can include etching a trench (or via) through isolation layer 123 (using, for example, a mask) and filling the etched trench with metal fill. Also, forming source contact 129 can include etching a trench (or via) through isolation layer 123 and first dielectric layer 105 (using, for example, a mask) and filling the etched trench with metal fill.

Figure 4:
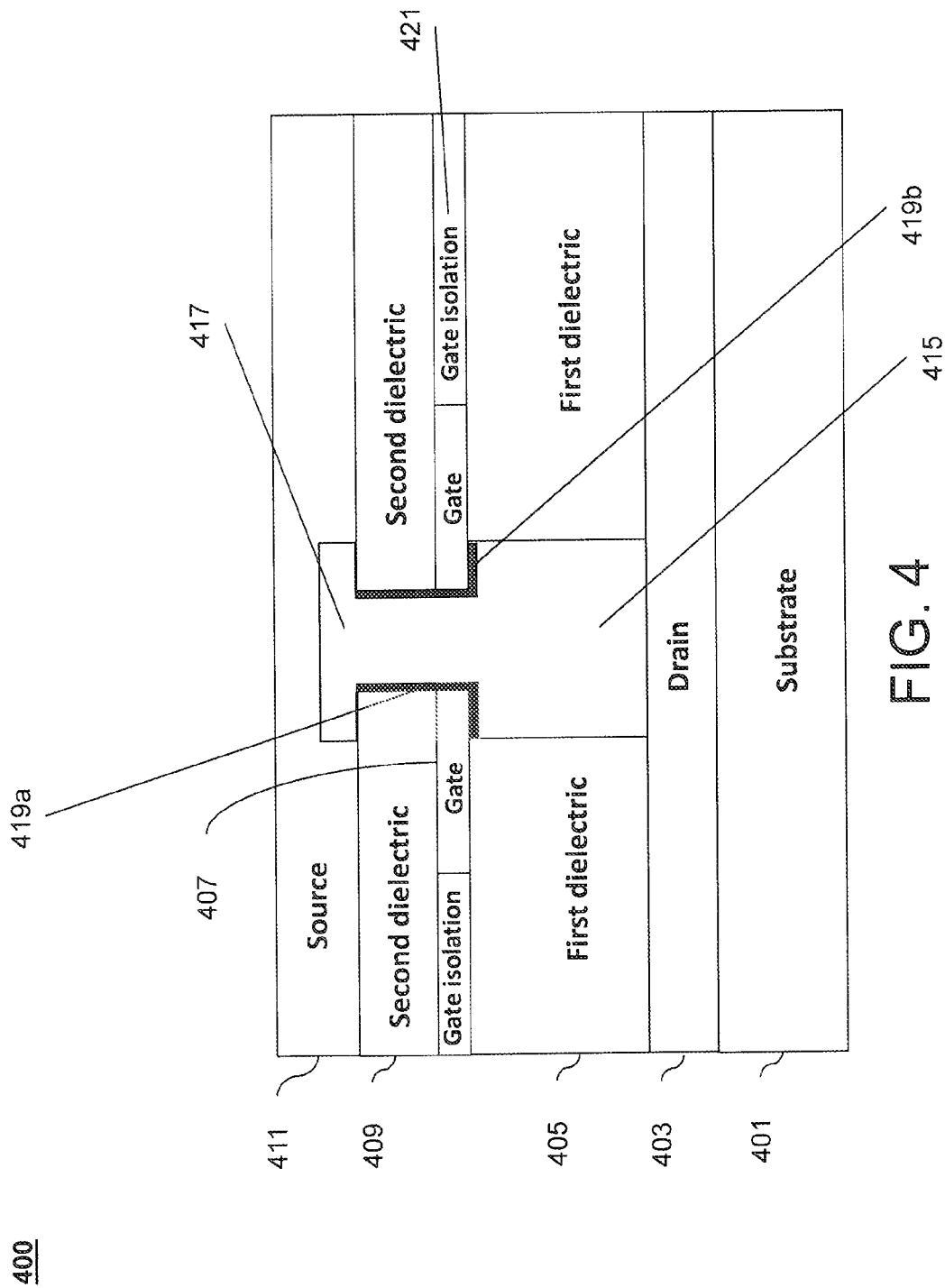
FIG. 4 illustrates a side view of a semiconductor device, in accordance with another embodiment of the present disclosure.
Figure 5A:
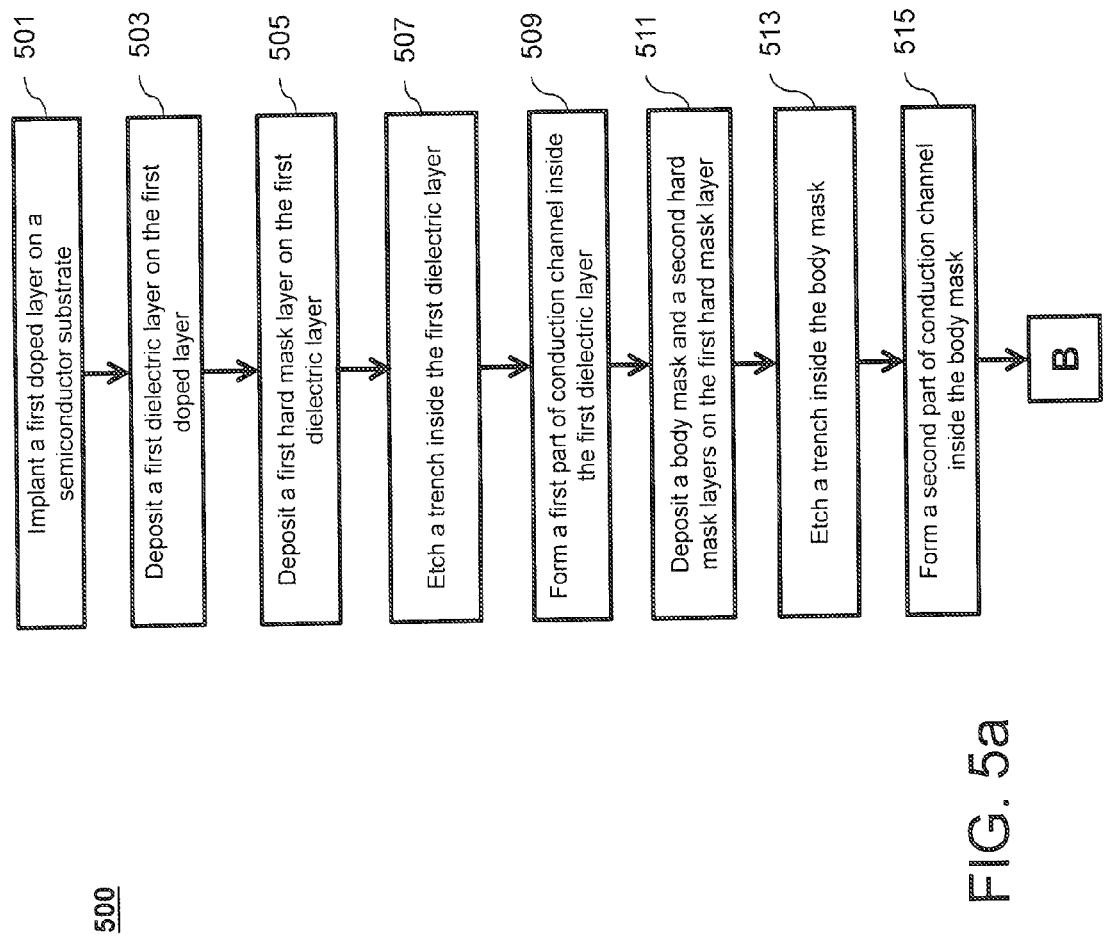
FIGS. 5a-5c are flowcharts illustrating a manufacturing process, in accordance with another embodiment of the present disclosure.
Figure 5B:
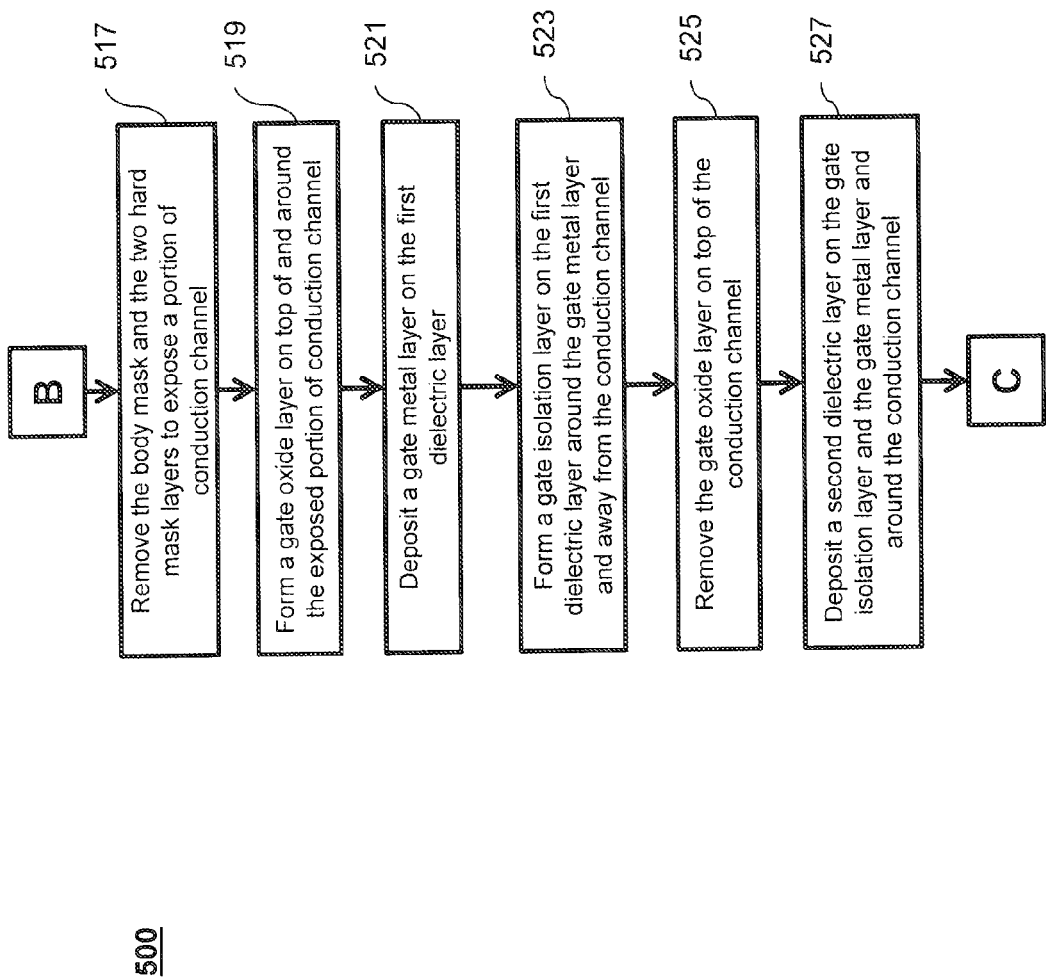
Figure 5C:
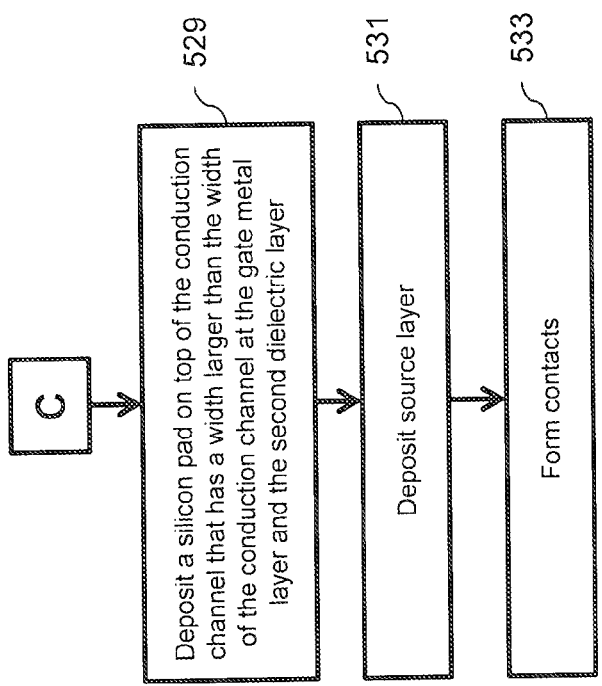

According to example, semiconductors manufactured using the manufacturing process of FIG. 2a-2b and 3a-3i (e.g., one or more of semiconductors 100, 130, and 150) provides: a fully-depleted regime of operation that better controls short-channel effects, reduced substrate sensitivity, and improved sub-threshold slope. Further, since the gate width can be decoupled from the packing density, the manufacturing process of FIGS. 2a-2b and 3a-3i can result in higher packing density. In other words, more semiconductor devices can be packed in a given area, FIG. 4 illustrates a semiconductor device 400, according to an embodiment of the present disclosure. Semiconductor device 400, which can include a vertical laterally diffused metal-oxide-semiconductor field-effect transistor (VLDMOS), is built on a substrate 401, such as a silicon substrate. Semiconductor device 400 further includes a first dope layer, such as drain layer 403 that is implanted in or on substrate 401. Although the first layer implanted in substrate 401 is shown as drain layer 403, it will be apparent to a person skilled in the relevant art that the first layer implanted in substrate 401 can be a source layer. Semiconductor device 400 further includes a first dielectric layer 405 that is deposited over drain layer 403. First dielectric layer 405 is arranged as a spacer between gate metal layer 407 and drain layer 403.

Semiconductor device 400 further includes gate metal layer 407 deposited over first dielectric layer 405. The thickness (e.g. vertical thickness) of gate metal layer 407 can be adjusted to achieve a desired gate channel length. According to embodiments of this disclosure, the gate metal layer 407 can comprise titanium, titanium nitride, tantalum, tantalum nitride, aluminum, tungsten, or any other suitable metal or metal alloy. Additionally, gate metal layer 407 can comprise any combination of suitable metals or metal alloys. Gate metal layer 407 can be deposited by physical vapor deposition (PVD), chemical vapor deposition (CVD), atomic layer deposition (ALD), or any other suitable method of deposition. According to this exemplary embodiment, since gate metal layer 407 is deposited using ALD or other thin film deposition methods, the thickness of gate metal layer, which defines the gate channel length, can be accurately controlled and does not depend on lithography methods. Therefore, the thickness of the gate is not limited by lithography capability. According to one example, gate metal layer 407 is defined by atomic layer deposition (ALD), which has single atomic layer precision and its thickness can be as thin as 15A, which is 1.5 nm.

According to one embodiment, semiconductor device 400 can include a gate isolation layer 421 that is arranged on first dielectric layer 405 and around gate metal layer 407. Semiconductor device 400 can also include a second dielectric layer 409, which is deposited on gate metal layer 407 and gate isolation layer 421. Semiconductor device 400 also includes second doped layer, such as source layer 411 that is deposited on second dielectric layer 409.

The various layers of semiconductor device 400 provide a vertical stack of layers as shown. Semiconductor device 400 can also include a rectangular trench or a circular hole (e.g. via) that extends vertically through the vertical stack of layers including second dielectric layer 409, gate metal layer 407 and first dielectric layer 405, where the trench or hole terminates at the top portion or surface of the drain layer 403. Although a rectangular trench or a circular hole are referenced in this disclosure, it will be apparent to a person skilled in the relevant art that other shapes of trenches can be used. This rectangular trench or circular hole includes conduction channel 415, which can be formed using epitaxy or ALD according to various embodiments so that the conduction channel is a solid cylinder or rectangular block of semiconductor material. In one example, conduction channel 415 can include a silicon material that is doped lightly with respect to source layer 411 and drain layer 403. Additionally or alternatively, conduction channel 415 can be doped with a material different from doping of drain layer 403 and source layer 411.

The semiconductor device 400 operates as a field effect transistor (FET), where an appropriate gate voltage forms a conducting channel for "carriers" (e.g. electrons or holes) that travel from the source layer 411 to drain layer 403. In this example, the current flows vertically from the source layer 411 to the drain layer 403 (for electron carriers) in a direction perpendicular to the surface of substrate 401. The gate channel length of the semiconductor device 400 is defined by thickness of gate metal layer 407, which is in electrical contact with, the conduction channel 415. Although, the entire conduction channel 415 is able to operate as a channel, carriers will tend to accumulate on the outer surface of the conduction channel 415 close to the gate layer due the strength of the electric field at the gate, as will be understood by those skilled in the arts. Accordingly, the carrier conduction channel is a vertical wall shaped accordingly to the outer surface of the conduction channel 415, and therefore may be cylindrical, rectangular, or another shape that is defined by the inner surface of the trench holding the conduction channel 415. This structure provides increased junction contact area for the conduction channel 415 with the gate layer 407 when compared to conventional structures because the gate layer 407 surrounds, and is in electrical contact with, the conduction channel 415. Accordingly, the semiconductor device 400 supports increased carrier flow from the source layer 411 to the drain layer 403, and therefore also supports higher switching current when compared to conventional structures.

Still referring to FIG. 4, the thickness of conduction channel 415 that is arranged between the bottom surface of the gate metal layer 407 and the top surface of the drain layer 403 (e.g., a first portion of conduction channel 415 extending through the first dielectric layer 405) is larger than the thickness of conduction channel 415 that is arranged between the top surface of the gate metal layer 407 and the bottom surface of the source layer 411 (e.g., a second portion of conduction channel 415 extending through the second dielectric layer 409). In other words, the thickness of first dielectric layer 405 is greater than the thickness of second dielectric layer 409. In one example, the thickness of first dielectric layer 405 can be twice the thickness of second dielectric layer 409. Alternatively, the relative thickness of first dielectric layer 405 compared to the thickness of second dielectric layer 409 can be an order of magnitude. The larger thickness of the first portion of the conduction channel 415 during the first dielectric layer 405 increases the resistivity between drain and gate, which increases the breakdown voltage of the semiconductor device 400. Additionally or alternatively, the resistance can be increased by changing the material used for conduction channel 415 and/or implanting different material.

Additionally or alternatively, the width of conduction channel 415 that is arranged between gate metal layer 407 and drain layer 403 (e.g., the first portion of conduction channel 415 at first dielectric layer 405) is larger than width of conduction channel 415 that is arranged between gate metal layer 407 and source layer 411 (e.g., the second portion of conduction channel 415 at second dielectric layer 409). The width is a dimension that is perpendicular to the thickness dimension described above in FIG. 4.

According to one example, conduction channel 415 terminates at drain layer 403 and source layer 411. Alternatively, conduction channel 415 can extend into drain layer 403 and/or source layer 411. For example, FIG. 4 illustrates one example where conduction channel 415 extends into source 411 to form an extended electrical connection layer 417. In one example, extended electrical connection layer 417 can be a silicon pad that is formed over conduction channel 415 and inside source layer 411. According to one example, extension layer 417 can result in higher switching current for semiconductor device 400 due to increased junction contact area, Additionally or alternatively, conduction channel 415 can extend vertically, entirely or partially, through source layer 411, or drain layer 403, or both layers. In other words, in one embodiment, extended electrical connection layer 417 can extend from the top of source layer 411 to the bottom of drain layer 403.

Semiconductor device 400 can further include a gate oxide including a gate work-function and high-k dielectric 419 that is formed at gate metal layer 407 inside the rectangular trench or circular hole. As shown in FIG. 4, gate work-function and high-k dielectric 419 starts at the bottom portion of gate metal layer 407 where first dielectric layer 405 and gate metal layer 407 intersect and terminates at top portion of second dielectric layer 409 where second dielectric layer 409 and source layer 411 intersect. Gate work-function and high-k dielectric 419a wraps around a portion of conduction channel 415 that extends through gate metal layer 407 and second dielectric layer 409. Gate work-function and high-k dielectric 419b is a layer that wraps around but it is arranged over the portion of conduction channel 415 at the first dielectric layer 405. Gate work function and high-K dielectric 419a,b facilitate the gate metal contact.

Similar to semiconductor device 100, semiconductor device 400 can further include a gate contact, a drain contact, and a source contact (not shown) that are connected to gate metal layer 407, drain layer 403, and source layer 411, respectively. The respective contacts provide the necessary voltages to operate the semiconductor device 100.

FIGS. 5a-5c and 6a-6j illustrate a manufacturing process for manufacturing semiconductor 400, in accordance with an embodiment of the present disclosure. It is to be appreciated not all steps may be needed to perform disclosure provided herein. Further, some of the steps may be performed simultaneously, or in a different order than that shown in FIGS. 5a-5c and 6a-6j, as will be understood by those skilled in the art.

Figure 6A:
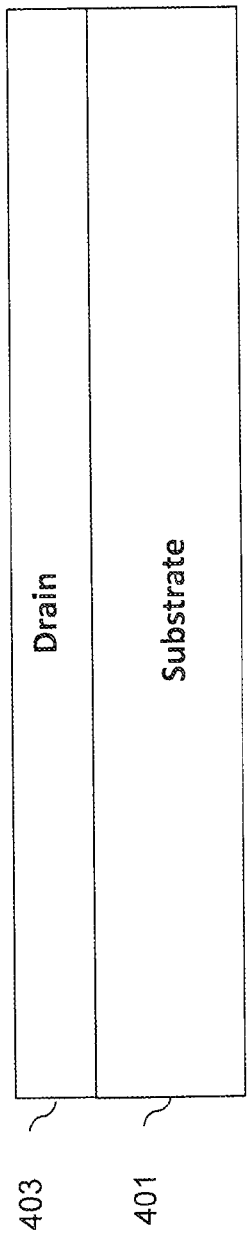
FIGS. 6a-6j illustrate a manufacturing process, in accordance with another embodiment of the present disclosure.
Figure 6B:
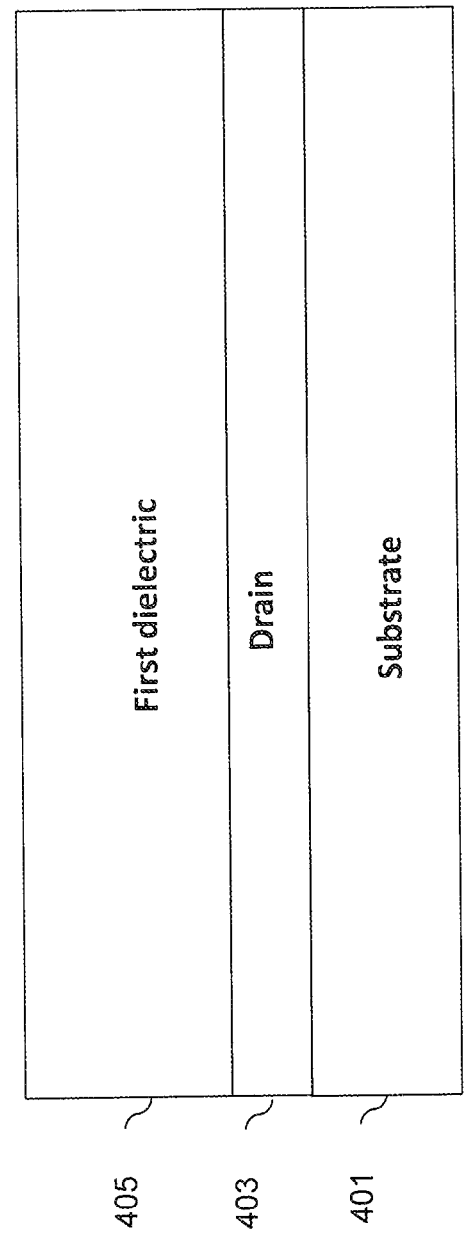

In step 501, as shown in FIG. 6a, a first doped layer, such as drain layer 403, is implanted on or in substrate 401. As illustrated in FIG. 6b and step 503, a first dielectric layer 405 is deposited over first doped layer, such as drain layer 403.

According to one example, first dielectric layer 405 acts as a spacer between drain layer 403 and gate metal layer 407. In one example, first dielectric layer 405 can include a high-k dielectric, silicon oxide (SiOx), silicon nitride (SiN), or any other insulator material, and/or a combination thereof.

Figure 6C:
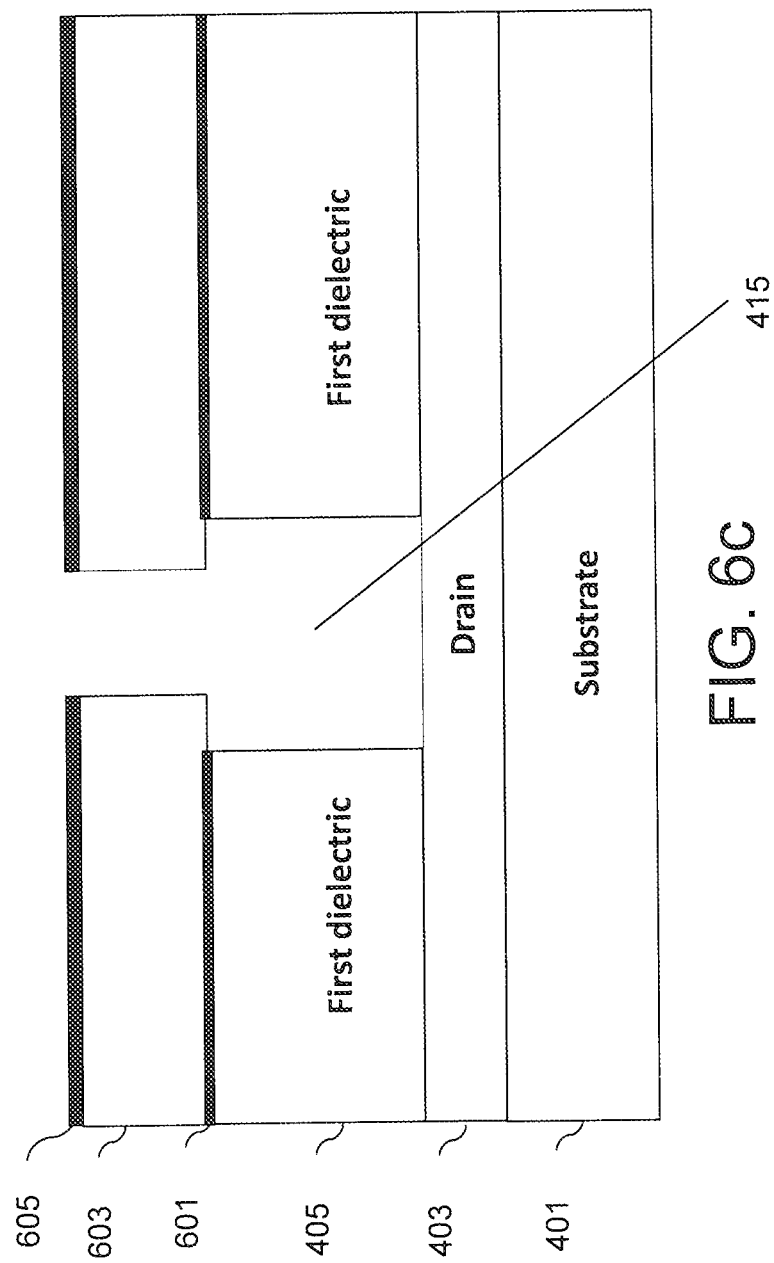

In steps 505-515, as shown in FIG. 6c, conduction channel 415 is formed (e.g., grown). In steps 505 and 507, first hard mask 601 is deposited over first dielectric layer 405 and a trench, such as but not limited to a rectangular trench or a circular hole, is etched through first dielectric 405. First hard mask 601 defines the first width of the conduction channel that is arranged between gate metal layer 407 and drain layer 403 (e.g., the first portion of conduction channel 415 extending through first dielectric layer 405). In step 509, the first portion of conduction channel 415 is formed (e.g. grown) in the etched trench in a similar fashion to that described for semiconductor device 100. According to one example, conduction channel 415 can include a silicon channel and can be grown using epitaxy or ALD. Conduction channel 415 can be lightly-doped relative to that of the source and drain layers.

In step 511, as shown in FIG. 6c, a body mask 603 is deposited over first hard mask 601 and first part of conduction channel 415. Next, a second hard mask layer 605 is deposited over body mask 603. In step 513, a second trench, such as but not limited to a rectangular trench or a circular hole, is etched through body mask 603. Second hard mask 605 defines the second width of the conduction channel that is arranged between first dielectric layer 405 and source layer 411 (e.g., the second portion of conduction channel 415 extending through metal gate layer 407 and second dielectric layer 409). In step 515, the second portion of conduction channel 415 is formed (e.g. grown) in the second etched trench. According to one example, the width of the first portion of conduction channel 415 extending through first dielectric layer 405 is larger than the width of the second portion of conduction channel 415 extending through body mask 603, where the width dimensions are perpendicular to the thickness dimensions in the cut view.

In step 517, first hard mask 601, body mask 603, and second hard mask 605 are removed using one or more removal processes. In one example, removal processes can include mechanical or chemical polishing processes, an etching process, an atomic layer removal (where atomic layers are removed layer by layer), or other removal processes, and/or a combination thereof. By removing first hard mask 601, body mask 603, and second hard mask 605, the second portion of conduction channel 415 that is above first dielectric layer 405 is exposed.

Figure 6D:
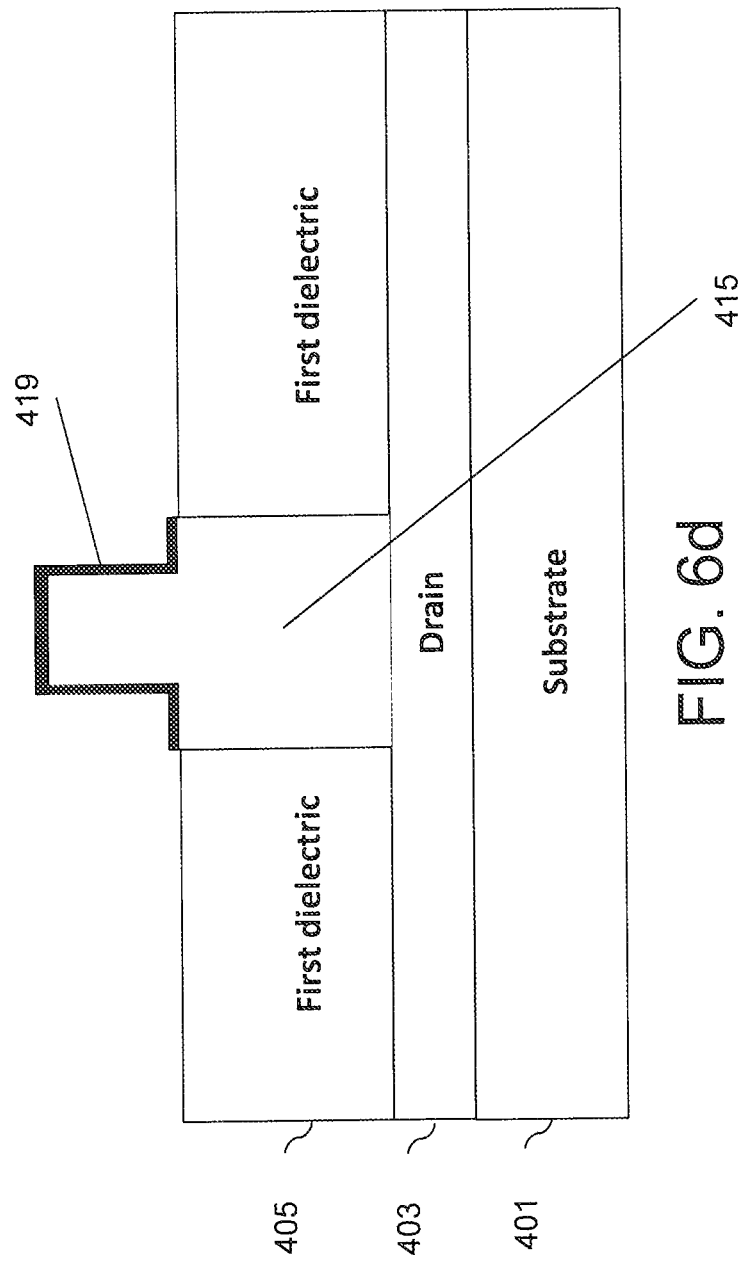

In step 519, as shown in FIG. 6d, a gate oxide layer 419 is formed on top of and around the second portion of conduction channel 415 that is above first dielectric layer 405 and now exposed. According to one example, a gate oxide, such as a high-k dielectric is deposited on the exposed portion of conduction channel 415. Step 519 further can include depositing a metal gate work-function. Growing or depositing the metal gate work-function can include depositing multiple different metal materials on the deposited gate oxide, to produce the gate oxide and metal gate work-function 419.

Figure 6E:
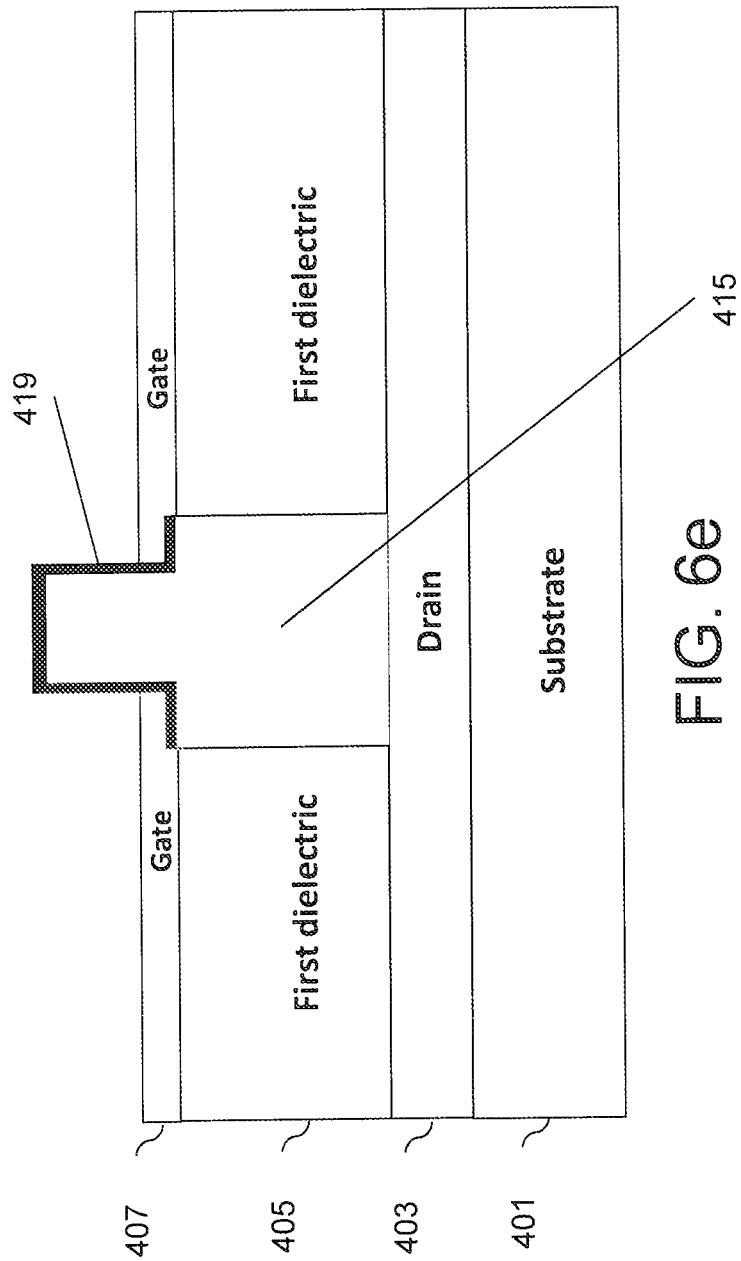

In step 521, as shown in FIG. 6e, gate metal layer 407 is deposited on first dielectric layer 405 and portions of in gate oxide and metal gate work-function 419 that is substantially at the same level of first dielectric layer 405. According to embodiments of this disclosure, gate metal layer 407 can be deposited by physical vapor deposition (PVD), chemical vapor deposition (CVD), atomic layer deposition (ALD), or any other suitable method of deposition. The thickness of gate metal layer 407, which defines the gate channel length, can be adjusted to achieve a desired gate channel length. According to one example, the vertical thickness of gate metal layer 407 can approximately be 10 nm, 7 nm, 5 nm, 3 nm, 2 nm, or some other channel length.

Figure 6F:
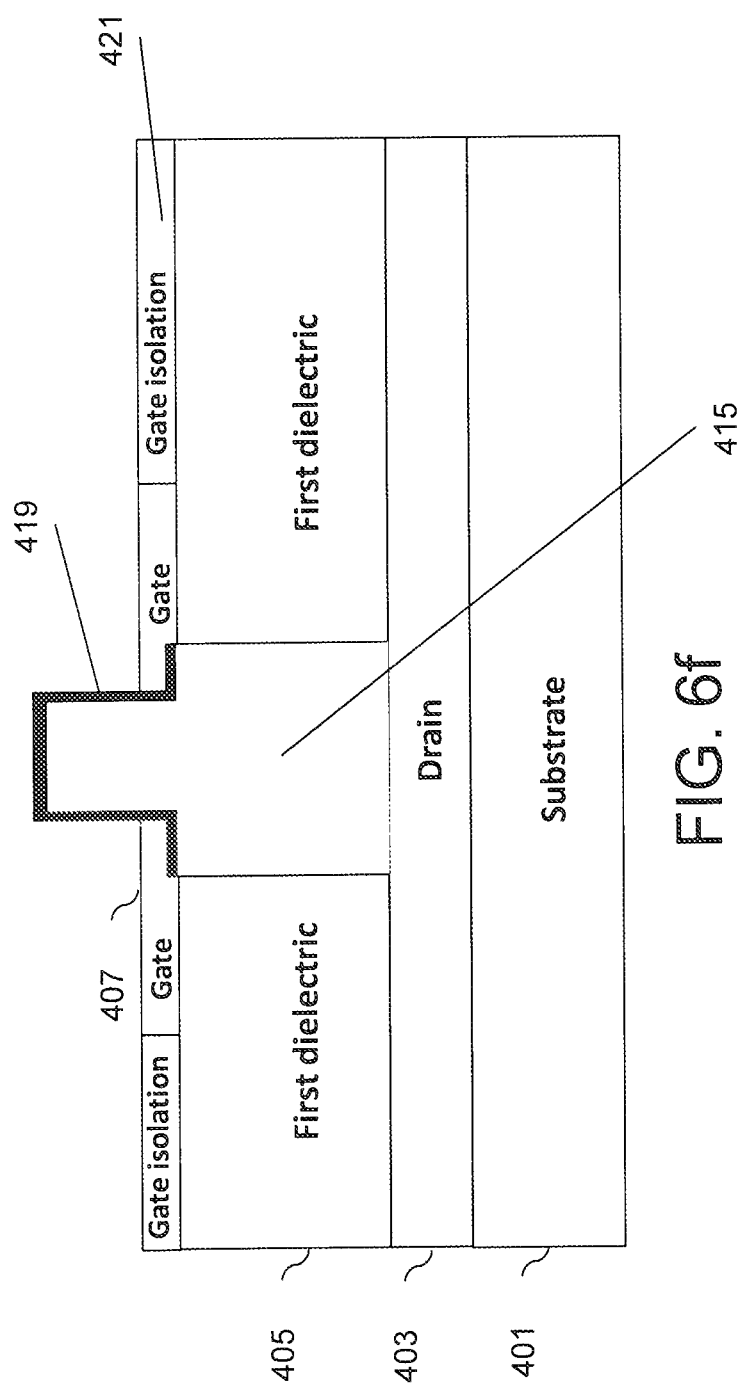

In step 523, as shown in FIG. 6f, a gate isolation layer 421 is formed on the first dielectric layer 405 around the gate metal layer 407 and away from the conduction channel 415. According to one example, step 523 can include using a mask and etching away the necessary portion of gate metal layer 407 needed for gate isolation layer 421 and then depositing gate isolation layer 421.

Figure 6G:
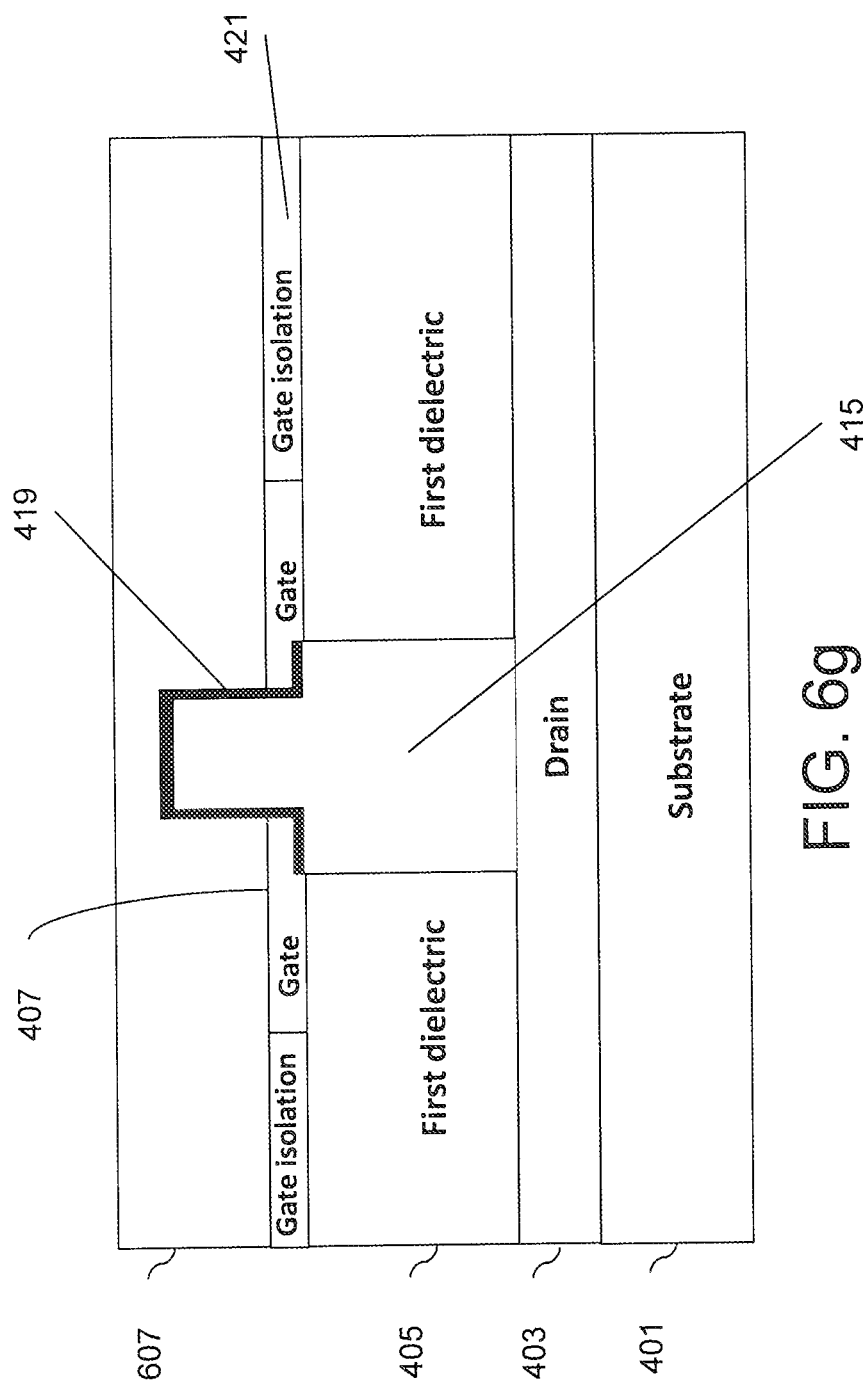
Figure 6H:
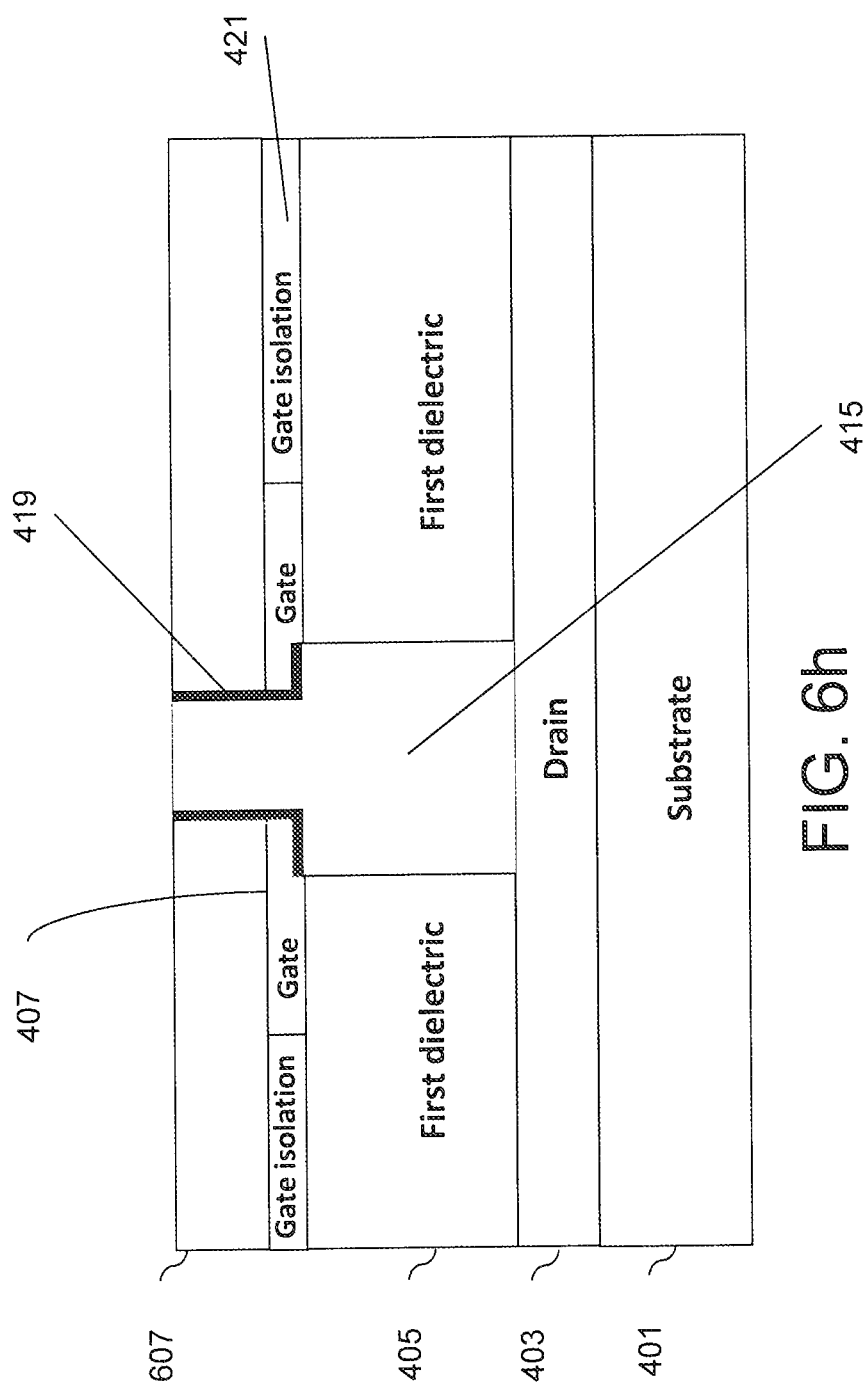

In step 525, as shown in FIGS. 6g and 6h, a portion of gate oxide and metal work-function layer 419 that is arranged on top of the conduction channel 415 is removed. According to one example, step 525 is performed using a Chemical Mechanical Polishing/Planarization (CMP) process that is a process of smoothing surfaces with the combination of chemical and mechanical forces. In one example, a CMP layer 607 is deposited, as illustrated in FIG. 6g. Next, as shown in FIG. 6h, the CMP layer 607 is polished using, for example, the CMP process until the portion of gate oxide and metal work-function layer 419 that is arranged on top of the conduction channel 415 is removed and the top portion of conduction channel 415 is exposed.

Figure 6I:
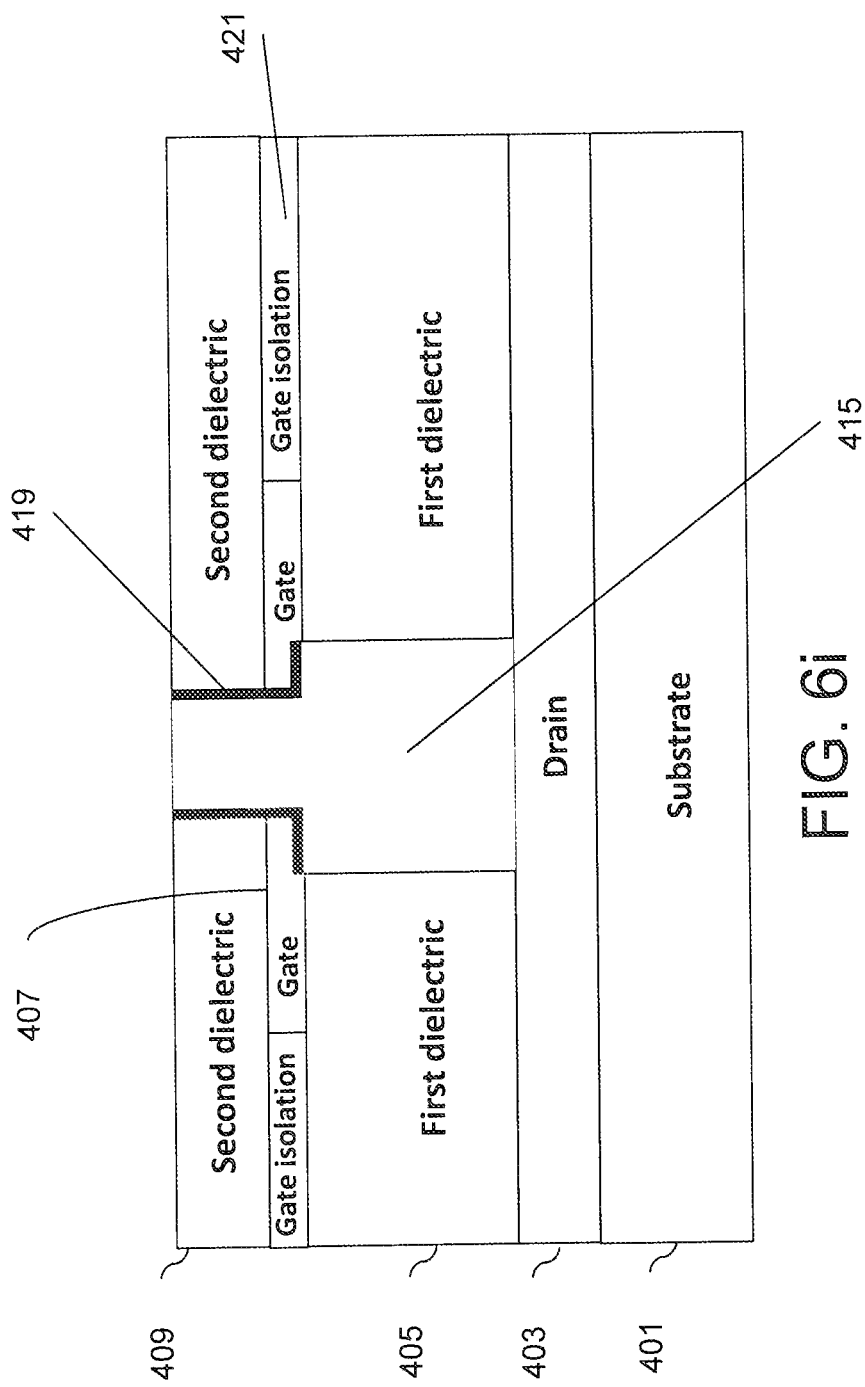

In step 527, as shown in FIG. 6i, second dielectric layer 409 is deposited so that CMP layer 607 is replaced with second dielectric layer 409. According to one example, the thickness of First dielectric layer 405 is greater than the thickness of second dielectric layer 409. In other words, the thickness of conduction channel 415 that is arranged between gate metal layer 407 and drain layer 403 (e.g., the first portion of conduction channel 415 extending through first dielectric layer 405) is larger than the thickness of conduction channel 415 that is arranged between gate metal layer 407 and source layer 411 (e.g., the second portion of conduction channel 415 extending through second dielectric layer 409). According to this example, the greater thickness of the first portion of conduction channel 415 at first dielectric layer 405 increases the resistivity between the drain and the gate region resulting in a higher breakdown voltage for the semiconductor device 400.

Figure 6J:
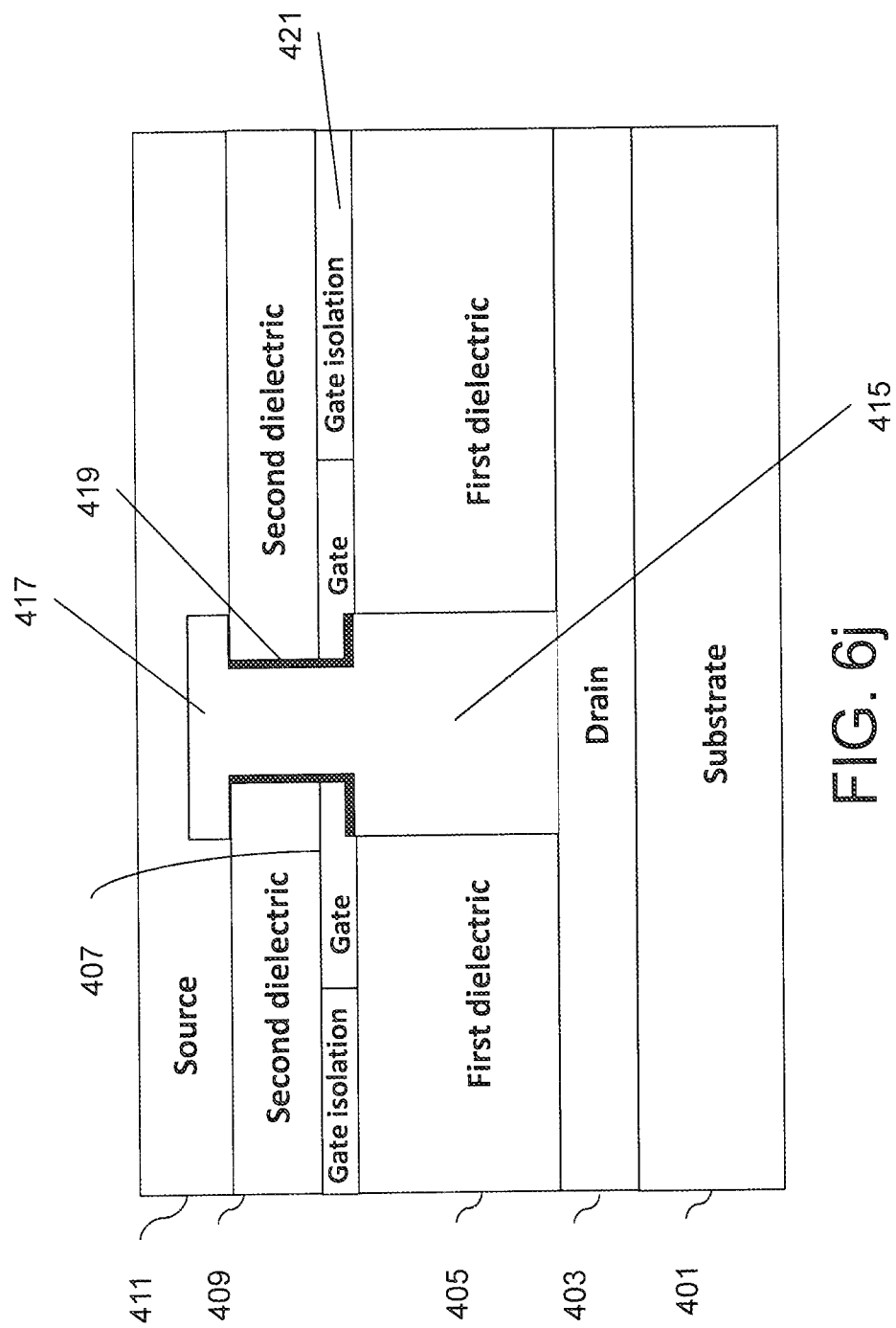

According to on example, in step 529, as shown in FIG. 6j, a silicon pad 417 is deposited over the second portion of conduction channel 415 and second dielectric layer 409. According to this example, depositing silicon pad 417 can include depositing a poly silicon layer over the second portion of conduction channel 415 and second dielectric layer 409 and patterning the silicon pad 417. In one example, silicon pad 417 has substantially the same width as the first portion of conduction channel 415 extending through the first dielectric layer 405. According to this example, the width of silicon pad 417 is larger than the width of the second portion of conduction channel 415 extending through the metal gate layer 407 and second dielectric layer 409. Source extension layer (silicon pad) 417 can result in higher switching current for semiconductor device 400 due to increased junction contact area. Alternatively, conduction channel 415 can terminate at drain layer 403 and source layer 411.

In step 531, as shown in FIG. 6j, second doped layer, such as source layer 411 is deposited over second dielectric layer 409 and silicon pad 417. In step 533, drain, source, and gate contacts (not shown) are formed. These contacts can be formed using a process similar to step 229 of FIG. 2b.

The exemplary embodiments described herein are provided for illustrative purposes, and are not limiting. Other exemplary embodiments are possible, and modifications may be made to the exemplary embodiments within the spirit and scope of the disclosure.

It is to be appreciated that the Detailed Description section, and not the Abstract section, is intended to be used to interpret the claims. The Abstract section may set forth one or more, but not all exemplary embodiments, of the disclosure, and thus, are not intended to limit the disclosure and the appended claims in any way.

The disclosure has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made therein without departing from the spirit and scope of the disclosure. Thus the disclosure should not be limited by any of the above-described exemplary embodiments. Further, the claims should be defined only in accordance with their recitations and their equivalents.

What is claimed is:

1. A semiconductor device, comprising:
   a first doped layer implanted in a semiconductor substrate forming one of a source or a drain;
   a gate metal layer disposed over the first doped layer;
   a second doped layer disposed over the gate metal layer forming the other of the source or the drain, wherein the first doped layer, the gate metal layer and the second doped layer form a vertical stack of layers of the semiconductor device; and
   a conduction channel formed in a trench that extends vertically through the first doped layer, the gate metal layer and the second doped layer of the vertical stack of layers and terminates at the semiconductor substrate.

2. The semiconductor device of claim 1, further comprising:
   a metal gate work-function formed over a portion of the gate metal layer inside the trench; and
   a high-k dielectric grown over the metal gate work-function inside the trench.

3. The semiconductor device of claim 1, further comprising:
   a first dielectric layer arranged between the first doped layer and the gate metal layer; and
   a hard mask and a second dielectric layer arranged between the gate metal layer and the second doped layer, the hard mask disposed over the gate metal layer and the second dielectric layer arranged between the hard mask and the second doped layer.

4. The semiconductor device of claim 1, further comprising:
   a first contact coupled to the first doped layer;
   a gate contact coupled to the gate metal layer; and
   a second contact coupled to the second doped layer.

5. The semiconductor device of claim 1, further comprising:
   a first extension grown inside the trench from the first doped layer to a bottom portion of the gate metal layer that is inside the trench; and
   a second extension grown inside the trench from the second doped layer to a top portion of the gate metal layer inside the trench.

6. The semiconductor device of claim 1, wherein the conduction channel formed in the trench extends beyond the trench to cover a portion of the second doped layer to form an extended electrical connection layer disposed over the second doped layer.

7. The semiconductor device of claim 6, further comprising:
   an isolation layer formed over the extended electrical connection.

8. The semiconductor device of claim 1, wherein the conduction channel formed in the trench terminates at a top surface of the second doped layer.

9. The semiconductor device of claim 1, wherein the gate metal layer is deposited using atomic layer deposition.

10. The semiconductor device of claim 1, wherein the conduction channel includes a silicon material that is doped relatively lightly with respect to the first and second doped layers.

11. The semiconductor device of claim 1, wherein the conduction channel is doped with a material different from doping of the first and second doped layers.

12. A semiconductor device, comprising:
    a first doped layer implanted in a semiconductor substrate forming one of a source or a drain;
    a first dielectric layer disposed over the first doped layer;
    a gate metal layer disposed over the first dielectric layer;
    a second dielectric layer disposed over the gate metal layer;
    a second doped layer disposed over the second dielectric layer forming the other of the source or the drain, wherein the first doped layer, the first dielectric layer, the gate metal layer, the second dielectric layer, and the second doped layer form a vertical stack of layers of the semiconductor device; and
    a conduction channel formed in a trench that extends vertically through the first doped layer, the first dielectric layer, the gate metal layer, the second dielectric layer, and the second doped layer of the vertical stack of layers, wherein a width of the conduction channel at the gate metal layer is smaller than a width of the conduction channel at the first dielectric layer underneath the gate metal layer.

13. The semiconductor device of claim 12, wherein a thickness of the conduction channel at the second dielectric layer is smaller than a thickness of the conduction channel at the first dielectric layer.

14. The semiconductor device of claim 12, further comprising:
    a gate isolation layer arranged between the first dielectric layer and the second dielectric layer, encompassing the gate metal layer.

15. The semiconductor device of claim 12, wherein the conduction channel is separated from the gate metal layer and the second dielectric layer by a gate oxide.

16. The semiconductor device of claim 12, wherein a width of the conduction channel at the second dielectric layer is substantially equal to the width of the conduction channel at the gate metal layer and is smaller than the width of the conduction channel at the first dielectric layer.

17. The semiconductor device of claim 16, further comprising a silicon pad formed on top of the conduction channel and inside the second doped layer.

18. The semiconductor device of claim 17, wherein a width of the silicon pad is substantially equal to the width of the conduction channel at the first dielectric layer.

19. The semiconductor device of claim 12, wherein the trench and the conduction channel extend vertically through the first doped layer and terminate at the semiconductor substrate.

20. The semiconductor device of claim 12, wherein the semiconductor device is a laterally diffused metal oxide semiconductor (LDMOS) and the conduction channel at the first dielectric layer increases resistance to allow higher voltage operation of the LDMOS.

\* \* \* \* \*